United States Patent
Chehade et al.

(10) Patent No.: US 11,664,295 B2
(45) Date of Patent: May 30, 2023

(54) WATER BLOCK ASSEMBLY

(71) Applicant: OVH, Roubaix (FR)

(72) Inventors: Ali Chehade, Templeuve (FR); Hadrien Bauduin, Villeneuve d'Ascq (FR)

(73) Assignee: OVH, Roubaix (FR)

(*) Notice: Subject to any disclaimer, the term of this patent is extended or adjusted under 35 U.S.C. 154(b) by 202 days.

(21) Appl. No.: 16/878,117

(22) Filed: May 19, 2020

(65) Prior Publication Data

US 2020/0373223 A1 Nov. 26, 2020

(30) Foreign Application Priority Data

May 23, 2019 (EP) .................................... 19315038

(51) Int. Cl.
*H01L 23/473* (2006.01)
*F28F 3/08* (2006.01)
(Continued)

(52) U.S. Cl.
CPC .......... *H01L 23/473* (2013.01); *F28D 1/0316* (2013.01); *F28F 1/022* (2013.01);
(Continued)

(58) Field of Classification Search
CPC ... H01L 23/473; H01L 23/367; F28D 1/0316; F28D 2021/0028; F28D 9/0043;
(Continued)

(56) References Cited

U.S. PATENT DOCUMENTS 5,829,516 A * 11/1998 Lavochkin ............ H01L 25/117
                                                    29/890.038
6,719,039 B2 * 4/2004 Calaman ................ F28F 3/022
                                                   257/E23.098
(Continued)

FOREIGN PATENT DOCUMENTS

DE     102016220986 A1    5/2017
EP         2372762 A1    10/2011

OTHER PUBLICATIONS

European Search Report with regard to the counterpart European Patent Application No. 19315038.0 completed Oct. 30, 2019.
(Continued)

*Primary Examiner* — Stephen S Sul
(74) *Attorney, Agent, or Firm* — BCF LLP

(57) ABSTRACT

A water block assembly includes first and second water block units having respective first and second fluid conduits. The second water block unit is stacked on the first water block unit. The second fluid conduit operates either in parallel with the first fluid conduit or fluidly independent therefrom, such that cooled fluid is fed to the first and second fluid conduits. The first water block unit includes a first base portion and a first cover portion disposed on and affixed to the first base portion. The first cover portion defines a first fluid inlet and a first fluid outlet of the first fluid conduit. The second water block unit includes a second base portion and a second cover portion disposed on and affixed to the second base portion. The second cover portion defines a second fluid inlet and a second fluid outlet of the second fluid conduit.

18 Claims, 23 Drawing Sheets

(51) Int. Cl.
- *F28F 3/12* (2006.01)
- *F28D 1/03* (2006.01)
- *F28F 1/02* (2006.01)
- *F28F 3/02* (2006.01)
- *H01L 23/367* (2006.01)
- *H05K 7/20* (2006.01)
- *F28D 21/00* (2006.01)

(52) U.S. Cl.
CPC .............. *F28F 3/02* (2013.01); *F28F 3/08* (2013.01); *F28F 3/12* (2013.01); *H01L 23/367* (2013.01); *H05K 7/20254* (2013.01); *F28D 2021/0028* (2013.01)

(58) Field of Classification Search
CPC .......... F28D 9/0056; F28D 1/035; F28D 1/06; F28F 1/022; F28F 3/02; F28F 3/08; F28F 3/12; H05K 7/02218; H05K 7/20254; H05K 7/20772; H05K 7/20872; H05K 7/20927; H05K 7/20263; H05K 7/20272; G06F 1/20; G06F 2200/201

See application file for complete search history.

(56) References Cited

U.S. PATENT DOCUMENTS

| | | | |
|---|---|---|---|
| 6,754,076 B2 | 6/2004 | Cox et al. | |
| 8,464,781 B2 | 6/2013 | Kenny et al. | |
| 9,818,726 B2* | 11/2017 | Chainer | H01L 25/073 |
| 10,136,550 B2 | 11/2018 | Chainer et al. | |
| 10,260,781 B2* | 4/2019 | Lin | F25B 21/02 |
| 2005/0039885 A1* | 2/2005 | Vaidyanathan | H01L 23/3731 174/547 |
| 2005/0082037 A1* | 4/2005 | Thayer | F28F 13/003 257/E23.098 |
| 2005/0200001 A1 | 9/2005 | Joshi et al. | |
| 2007/0041160 A1* | 2/2007 | Kehret | H05K 7/20445 361/704 |
| 2007/0187072 A1* | 8/2007 | Chin | F28D 15/0266 165/104.21 |
| 2007/0274045 A1* | 11/2007 | Campbell | H01L 23/4735 165/80.4 |
| 2008/0024990 A1* | 1/2008 | Peng | H01L 23/473 361/699 |
| 2008/0105413 A1 | 5/2008 | Peng | |
| 2008/0236793 A1* | 10/2008 | Ma | F28F 3/12 165/80.4 |
| 2008/0264604 A1* | 10/2008 | Campbell | H01L 23/427 165/80.4 |
| 2009/0065178 A1* | 3/2009 | Kasezawa | H01L 23/473 165/104.19 |
| 2010/0078155 A1* | 4/2010 | Morra | F28D 15/00 165/104.19 |
| 2011/0232882 A1* | 9/2011 | Zaffetti | F28F 3/12 165/168 |
| 2012/0073309 A1* | 3/2012 | Hung | F25B 21/02 62/3.3 |
| 2012/0247526 A1* | 10/2012 | Okuda | H01L 35/30 136/201 |
| 2012/0305218 A1* | 12/2012 | Masefield | H01L 23/473 165/67 |
| 2013/0044431 A1* | 2/2013 | Koeneman | H01L 25/0657 361/699 |
| 2013/0248162 A1 | 9/2013 | Deighton | |
| 2015/0059360 A1* | 3/2015 | Lin | F25B 21/02 165/104.31 |
| 2015/0230366 A1 | 8/2015 | Shedd et al. | |
| 2016/0160813 A1* | 6/2016 | Amaral | F02M 31/102 123/557 |
| 2016/0204486 A1 | 7/2016 | Kenny et al. | |
| 2016/0242313 A1 | 8/2016 | Singh et al. | |
| 2018/0098458 A1* | 4/2018 | Chainer | H05K 7/20254 |
| 2018/0100710 A1* | 4/2018 | Chainer | H05K 7/20309 |
| 2020/0003497 A1* | 1/2020 | Aston | H05K 7/20254 |
| 2020/0328139 A1* | 10/2020 | Chiu | H01L 25/0657 |
| 2021/0216121 A1* | 7/2021 | Weldon | G06F 1/20 |
| 2021/0280497 A1* | 9/2021 | Brun | H01L 23/053 |
| 2021/0407888 A1* | 12/2021 | Elsherbini | H01L 23/46 |

OTHER PUBLICATIONS

Siyabi et al., "Experimental and Numerical Thermal Analysis of Multi-Layered Microchannel Heat Sink for Concentrating Photovoltaic Application", https://www.mdpi.com/journal/energies, Energies, 2019, 12, 122; pp. 1-25.

Office Action with regard to the counterpart European Patent Application No. 19315038.0 dated May 12, 2022.

English Abstract for DE102016220986 retrieved on Espacenet on May 25, 2022.

* cited by examiner

WATER BLOCK ASSEMBLY

CROSS-REFERENCE

The present application claims priority to European Patent Application No. 19315038.0, filed on May 23, 2019, the entirety of which is incorporated herein by reference.

FIELD OF TECHNOLOGY

The present technology relates to water blocks.

BACKGROUND

Heat dissipation is an important consideration for computer systems. Notably, many components of a computer system, such as a processor (also referred to as central processing unit (CPU)), generate heat and thus require cooling to avoid performance degradation and, in some cases, failure. Moreover, with advancing technological progress, computer components are not only becoming more performant but also have a greater associated thermal design power (TDP) (i.e., a maximum amount of heat generated thereby which a cooling system should dissipate) thus emphasizing the need to improve cooling solutions therefor.

Many solutions exist for promoting heat dissipation in computer systems. Amongst them are heat sinks which rely on a heat transfer medium (e.g., a gas or liquid) to carry away the heat generated by a particular component of the computer system. For instance, a water block, which is a watercooling heat sink, is thermally coupled to the component to be cooled (e.g., the processor) and water is made to flow through a conduit in the water block to absorb heat from the component. As water flows out of the water block, so does the heat absorbed thereby.

However, water blocks are susceptible to clogging which can negatively affect their heat dissipation performance as water flow is restricted. For example, limescale deposits can form in a water block's fluid conduit from the accumulation of impurities (e.g., calcium) contained in the water flowing therethrough. This reduces water flow through the water block and thus negatively affects the heat dissipation capability of the water block. In some cases, the fluid conduit of a water block can become so clogged as to reduce heat dissipation substantially which, if not addressed promptly, can lead to overheating of the target component which can cause a decreased performance or even failure of the target component intended to be cooled by the water block.

There is therefore a desire for a water block which can alleviate at least some of these drawbacks.

SUMMARY

It is an object of the present technology to ameliorate at least some of the inconveniences present in the prior art.

According to one aspect of the present technology, there is provided a water block assembly configured to be installed on a target component. The water block assembly includes a first water block unit having a first fluid conduit and a second water block unit having a second fluid conduit, the second water block unit being stacked on the first water block unit. The second fluid conduit operates either in parallel with the first fluid conduit or fluidly independent from the first fluid conduit, such that cooled fluid is fed to each of the first and second fluid conduits. The first water block unit includes: a first base portion having an external thermal transfer surface configured to be in contact with the target component, the first base portion partly defining the first fluid conduit; and a first cover portion disposed on and affixed to the first base portion. The first cover portion defines a first fluid inlet and a first fluid outlet for feeding fluid into and discharging fluid from the first fluid conduit respectively. The first cover portion partly defines the first fluid conduit. The second water block unit includes a second base portion in thermal contact with the first cover portion of the first water block unit, the second base portion partly defining the second fluid conduit. The second base portion is dimensioned smaller than the first cover portion such that a section of the first cover portion extends outward from the second base portion. The first fluid inlet and the first fluid outlet are defined in the section of the first cover portion that extends outward from the second base portion. The second water block unit also includes a second cover portion disposed on and affixed to the second base portion. The second cover portion defines a second fluid inlet and a second fluid outlet for feeding fluid into and discharging fluid from the second fluid conduit respectively. The second cover portion partly defines the second fluid conduit.

In some embodiments, each of the first and second base portions defines a recess defining at least in part a path of a corresponding one of the first and second fluid conduits.

In some embodiments, each of the first and second base portions defines a pocket for receiving a corresponding one of the first and second cover portions.

In some embodiments, each of the first and second cover portions defines a generally planar lower surface facing a corresponding one of the first and second base portions and defining in part one of the first and second fluid conduits.

In some embodiments, the first and second cover portions are generally rectangular. The first fluid inlet and the first fluid outlet are located proximate diagonally opposite corners of the first cover portion. The second fluid inlet and the second fluid outlet are located proximate diagonally opposite corners of the second cover portion.

In some embodiments, the second cover portion has a first orientation feature for orienting the second cover portion relative to the second base portion; and the second base portion has a corresponding second orientation feature for orienting the second cover portion relative to the second base portion that matches the first orientation feature.

In some embodiments, the first cover portion includes a plurality of fins projecting downwardly toward the first base portion. The fins are received in respective locations within the recess of the first base portion.

In some embodiments, the first cover portion comprises a recess that is complementary to the recess of the first base portion such that the recess of the first cover portion and the recess of the first base portion collaborate with one another to define the first fluid conduit.

In some embodiments, the water block assembly also includes a lower member, an intermediate member and an upper member affixed to one another to form the first and second water block units. The lower member defines the first base portion of first water block unit, a lower side of the lower member defining the external thermal transfer surface configured to be in contact with the target component. The intermediate member defines the first cover portion of the first water block unit and the second base portion of the second water block unit such that a heat transfer interface between the first cover portion and the second base portion is constituted by a material of the intermediate member. The upper member defines the second cover portion of the second water block unit.

In some embodiments, the intermediate member has a lower side and an upper side opposite the lower side. The lower side of the intermediate member defines at least in part the first cover portion of the first water block unit, and the upper side of the intermediate member defines at least in part the second base portion of the second water block unit.

In some embodiments, the first base portion, the first cover portion, the second base portion and the second cover portion are separate components. A heat transfer interface between the first cover portion and the second base portion is defined between external surfaces of the first cover portion and the second base portion.

In some embodiments, the first cover portion has a lower side and an upper side opposite the lower side. The lower side of the first cover portion defines a generally planar lower surface facing the first base portion. The planar lower surface partly defines the first fluid conduit. The upper side of the first cover portion defines a generally planar upper surface facing the second base portion, the planar upper surface partly defining the heat transfer interface between the first cover portion and the second base portion.

In some embodiments, the first fluid conduit and the second fluid conduit operate fluidly independent from one another, each of the first fluid conduit and the second fluid conduit being fed cooled fluid by a respective fluid source.

In some embodiments, the first fluid conduit and the second fluid conduit operate in parallel on a same fluid circuit, each of the first fluid conduit and the second fluid conduit being fed cooled fluid by a common fluid source.

In some embodiments, the water block assembly further has two first tubes connected to the first fluid inlet and the first fluid outlet and two second tubes connected to the second fluid inlet and the second fluid outlet. The two first tubes are connected to the first water block unit at the first cover portion, and the two second tubes are connected to the second water block unit at the second cover portion.

In some embodiments, the recess of the first base portion is a first recess and the recess of the second base portion is a second recess. The first recess of the first base portion extends from a first end to a second end. The first end and the second end of the first recess are aligned with the first fluid inlet and the first fluid outlet respectively. The second recess of the second base portion extends from a first end to a second end. The first end and the second end of the second recess are aligned with the second fluid inlet and the second fluid outlet respectively.

In some embodiments, the recesses of the first and second base portions are milled.

In some embodiments, the water block assembly includes only three separate plate members including the lower member, the intermediate member and the upper member.

According to another aspect of the present technology, there is provided a water block assembly configured to be installed on a target component. The water block assembly includes: a lower member having an external thermal transfer surface configured to be in contact with the target component; an intermediate member disposed on and affixed to the lower member; and an upper member disposed on and affixed to the intermediate member. Together, the lower member and the intermediate member form a first water block unit of the water block assembly. Each of the lower member and the intermediate member defines in part a first fluid conduit of the first water block unit. The intermediate member defines a first fluid inlet and a first fluid outlet for feeding fluid into and discharging fluid from the first fluid conduit respectively. Together, the intermediate member and the upper member form a second water block unit of the water block assembly stacked on the first water block unit. Each of the intermediate member and the upper member defines in part a second fluid conduit of the second water block unit. The upper member defines a second fluid inlet and a second fluid outlet for feeding fluid into and discharging fluid from the second fluid conduit respectively. A heat transfer interface between the first water block unit and the second water block unit is constituted by a material of the intermediate member.

Embodiments of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of embodiments of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

DETAILED DESCRIPTION

Figure 1:
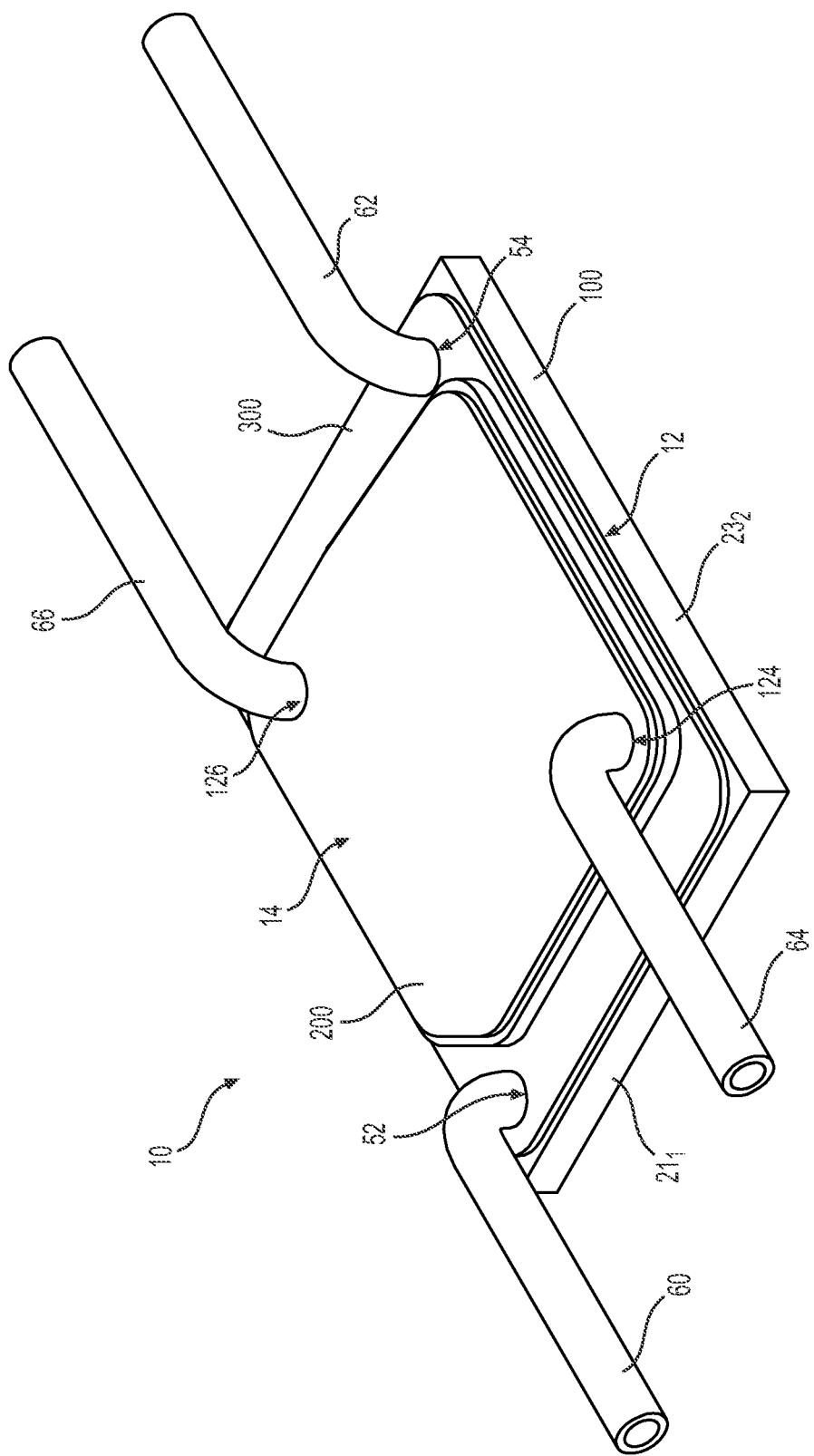
FIG. 1 is a perspective view of a water block assembly according to an embodiment of the present technology.
Figure 15:
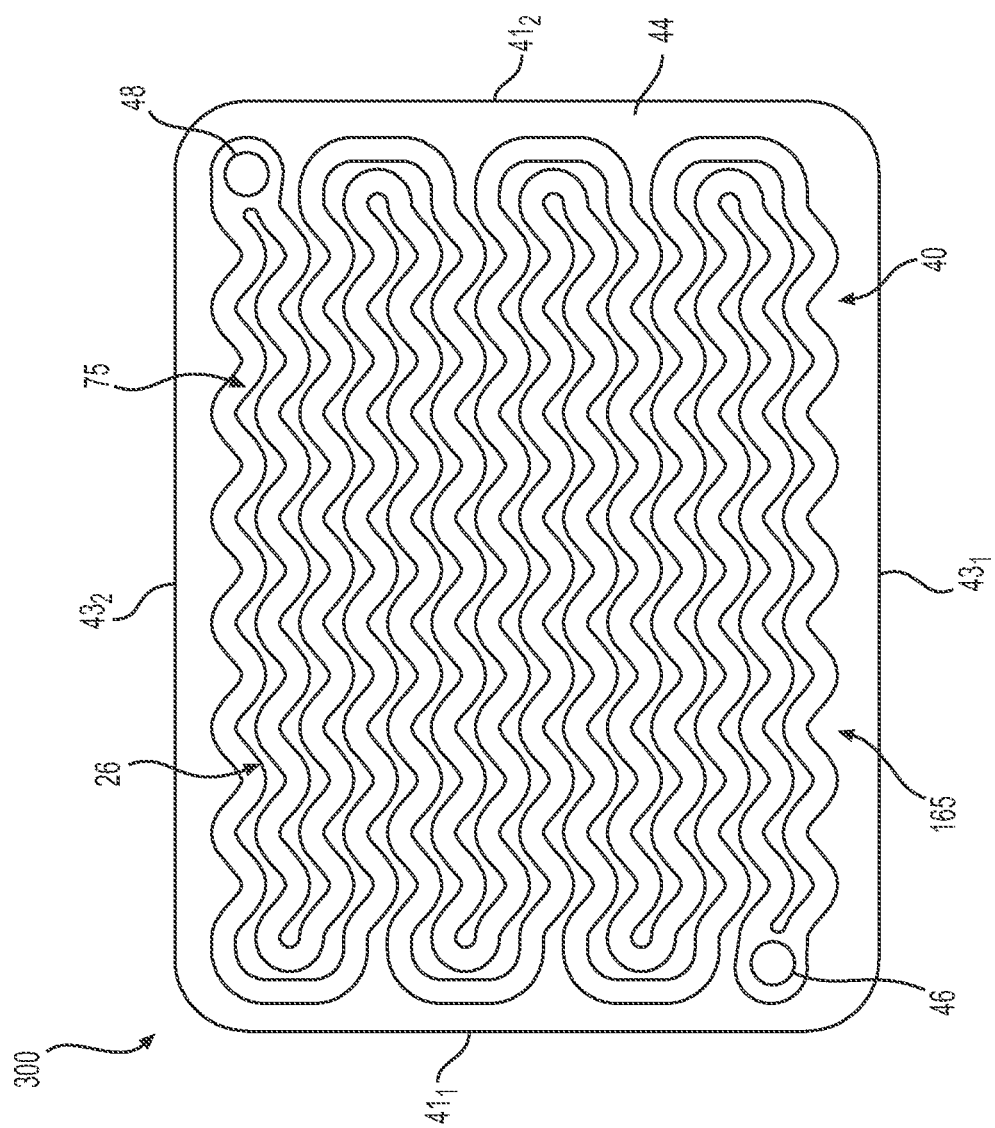
FIG. 15 is a bottom plan view of the intermediate plate member in accordance with an alternative embodiment.

FIG. 1 illustrates a thermal transfer device 10 in accordance with an embodiment of the present technology. As will be described herein, the thermal transfer device 10 is configured for cooling a target component 50 (FIG. 15). In this example, the target component 50 is a central processing unit (CPU) of a computer system 55 and is mounted to a motherboard thereof. In use, the CPU 50 generates a significant amount of heat and, as is known, can benefit from cooling. It is contemplated that the target component 50 could be any other suitable heat-generating component (e.g., a graphics processing unit (GPU)) or an intermediary component disposed between the thermal transfer device 10 and a heat-generating component. As will be described in detail below, in this embodiment, the thermal transfer device 10 is a water block assembly (i.e., a heat sink that uses water (e.g., demineralized water) or other fluid medium for transferring heat) and will be referred to as such herein. It is contemplated that a liquid (e.g., a refrigerant) other than water could be used in the water block assembly 10 in other embodiments. It is to be understood that the term "water block" is intended to include such thermal transfer devices that use fluids other than water and/or multiphase flow (e.g., two-phase flow). For example, in some instance, the fluid may be an oil, an alcohol, or a dielectric fluid (e.g., 3M Novec®).

The water block assembly 10 has a lower water block unit 12 and an upper water block unit 14 stacked on the lower water block unit 12 such that, in use, the lower water block unit 12 is disposed between the upper water block unit 14 and the target component 50. As will be described in greater detail below, the lower and upper water block units 12, 14 can, in some cases, provide the water block assembly 10 with redundancy such that if the lower water block unit 12 were to experience a decrease in performance (e.g., due to a blockage in its fluid conduit), the upper water block unit 12, 14 would continue cooling the target component 50. Moreover, the provision of two stacked water block units 12, 14 can improve the cooling capacity of the water block assembly 10 compared to a single water block unit that is not stacked with another water block unit.

In this embodiment, the water block assembly 10 includes three separate plate members which, when assembled together, form the water block assembly 10. Notably, the water block assembly 10 includes a lower plate member 100, an upper plate member 200, and an intermediate plate member 300 disposed between the lower and upper plate members 100, 200. As will be explained below, the lower, upper and intermediate plate members 100, 200, 300 define one or more portions of the lower or upper water block units 12, 14.

The members 100, 200, 300 are said to be "plate members" in that they are generally thin components. Notably, in this embodiment, each of the plate members 100, 200, 300 has a thickness between 3 mm and 8 mm, and preferably between 3 mm and 5 mm, which results in a relatively thin water block assembly 10 thus making the water block assembly 10 practical to implement in the context of a computer system. It is contemplated that the members 100, 200, 300 may have other thicknesses in other embodiments. Furthermore, in this embodiment, the plate members 100, 200, 300 are made of a thermally conducting material such as metal, for instance copper or aluminum. However, it is contemplated that the plate members 100, 200, 300 could be made from a different thermally conducting material in other embodiments, including combining different materials (e.g., one or more of the plate members 100, 200, 300 made from a different material than the other plate members).

The lower, upper and intermediate plate members 100, 200, 300 will now be described with reference to FIGS. 5 to 13. The manner in which the lower, upper and intermediate plate members 100, 200, 300 are assembled to form the water block assembly 10 will then be described.

The lower plate member 100 defines a base portion 150 of the lower water block unit 12. As such, in use, the lower plate member 100 is disposed atop the target component 50 and is in thermal contact with the target component 50 such as to allow the water block assembly 10 to absorb heat therefrom.

Figure 5:
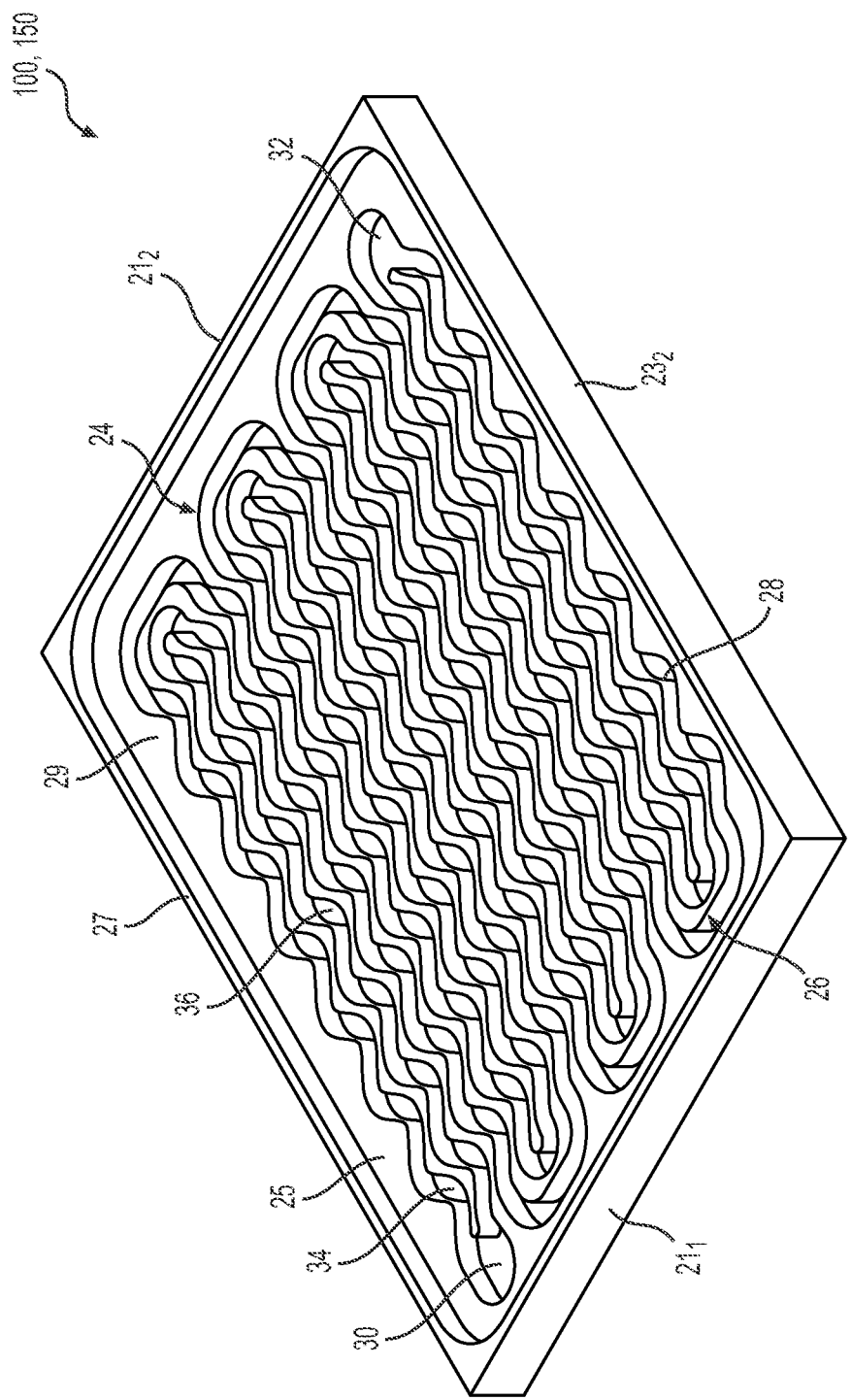
FIG. 5 is a perspective view of a lower plate member of the water block assembly of FIG. 1.
Figure 6:
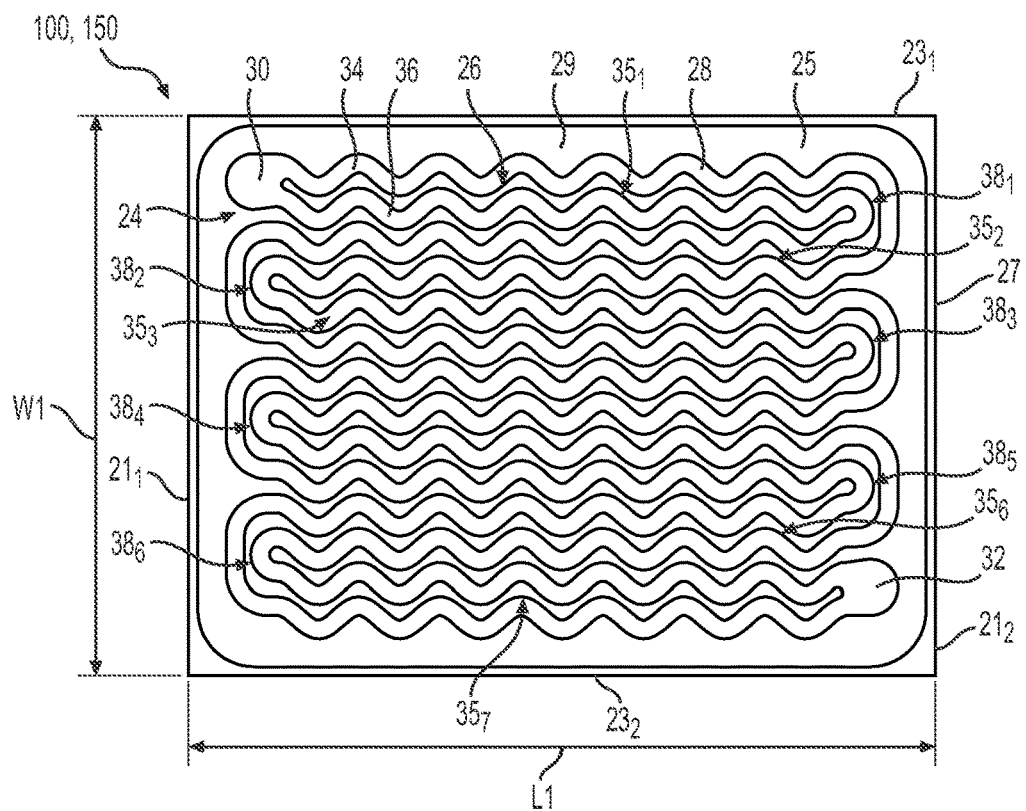
FIG. 6 is a top plan view of the lower plate member of FIG. 5.
Figure 7:
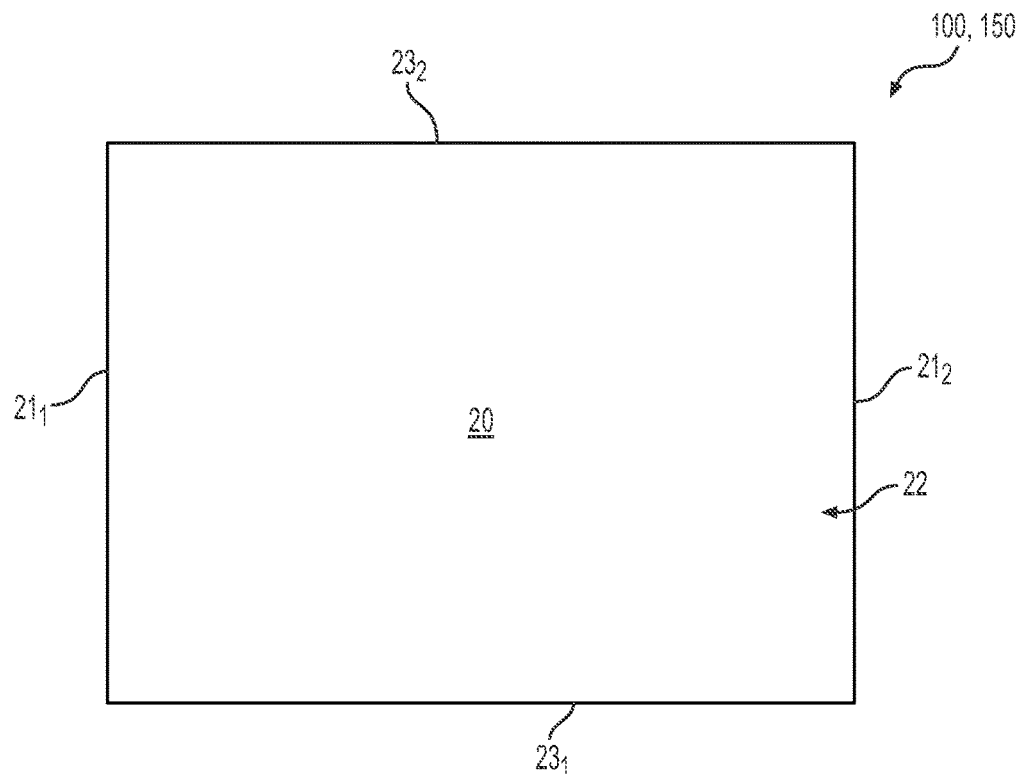
FIG. 7 is a bottom plan view of the lower plate member of FIG. 5.

With reference to FIGS. 5 to 7, the lower plate member 100 has a lower side 22 and an upper side 24 opposite the lower side 22. The lower plate member 100 has a lower external thermal transfer surface 20 defined on the lower side 22. In use, the thermal transfer surface 20 is placed in contact with the target component 50, as shown in FIG. 15. It is to be understood that in this context, the thermal transfer surface 20 is said to be "in contact" with the target component 50 even in cases where a thermal paste is applied between the thermal transfer surface 20 and the target component 50, in a manner that is known in the art, to ensure adequate heat transfer between the target component 50 and the thermal transfer surface 20.

As shown in FIGS. 5 and 6, on its upper side 24, the lower plate member 100 has a pocket 25 surrounded by a locating rim 27 which, in this embodiment, defines an outer periphery of the lower plate member 100. The pocket 25 is configured to receive the intermediate plate member 300. The locating rim 27 thus helps locate the intermediate plate member 300 on the lower plate member 100. In particular, the internal face of the locating rim 27 and the peripheral edge of the intermediate plate member 300 have complementary shapes so that the locating rim 27 is designed to partly surround the peripheral edge of the intermediate plate member 300. The pocket 25 is generally rectangular with rounded corners and defines an upper surface 29 of the lower plate member 100. The upper surface 29 defines a continuous recess 28 which partly defines a fluid conduit 26 of the lower water block unit 12. The fluid conduit 26 will thus be referred to as the "lower" fluid conduit 26. The lower fluid conduit 26 extends from a first end 30 to a second end 32 which correspond to first and second ends of the recess 28. The first and second ends 30, 32 of the lower fluid conduit 26 are, in this embodiment, located at diagonally opposite corners of the pocket 25. For instance, the first end 30 is located adjacent an intersection of a longitudinal end $21_1$ and a lateral end $23_1$ of the lower plate member 100, while the second end 32 is located adjacent an intersection of an opposite longitudinal end $21_2$ and an opposite lateral end $23_2$ of the lower plate member 100. As such, the first and second ends 30, 32 are located proximate opposite longitudinal and lateral sides of the water block assembly 10.

In this embodiment, the recess 28 is machined into the upper surface 29 of the lower plate member 100. For example, the recess 28 can be milled into the upper surface 29 by a milling machine (e.g., a numerically controlled mill). The recess 28 may be provided in the lower plate member 100 in any other suitable way in other embodiments (e.g., molded). Moreover, in this embodiment, the recess 28 has a depth of approximately 2 mm.

The path described by the lower fluid conduit 26, as defined by the recess 28, begins at the first end 30. The lower fluid conduit 26 branches into two channels 34, 36 at the first end 30 such that the flow of fluid within the lower fluid conduit 26 is split between both channels 34, 36. This may promote laminar flow of fluid within the lower fluid conduit 26 which reduces pressure drop of the fluid as it flows through the lower fluid conduit 26. The channels 34, 36 extend parallel to one another along at least a majority of a span of the lower fluid conduit 26. More specifically, in this embodiment, the channels 34, 36 extend parallel and adjacent to one another from the first end 30 to the second end 32. As will be described further below, the channels 34, 36 merge together again at the second end 32. However, in the span of the lower fluid conduit 26 between the first end 30 and the second end 32, the channels 34, 36 are fluidly separate from one another such that water flow from both channels 34, 36 does not mix until reaching the second end 32.

It is contemplated that, in alternative embodiments, the lower fluid conduit 26 could branch into more than two channels. For instance, the lower fluid conduit 26 could branch into three channels or four channels.

Furthermore, it is contemplated that, in alternative embodiments, the junction at which the lower fluid conduit 26 branches into the two channels 34, 36 could be at a location other than the first end 30. For example, the lower fluid conduit 26 could branch into the two channels 34, 36 at a junction downstream from the first end 30 (i.e., a location, along the path of the lower fluid conduit 26, further from the first end 30). Similarly, it is contemplated that, in alternative embodiments, the junction at which the two channels 34, 36 merge together could be upstream from the second end 32.

In this embodiment, the lower fluid conduit 26 forms a "serpentine" path. In this context, a serpentine path is herein defined as being a path that describes at least one S-shaped curve. More specifically, the fluid conduit 26 defines a plurality of longitudinally-extending sections $35_1$-$35_7$ that are parallel to one another and are laterally spaced from one another, with adjacent ones of the longitudinally-extending sections $35_1$-$35_7$ being connected by looping sections $38_1$-$38_6$. By extension, the channels 34, 36 of the lower fluid conduit 26 extend generally parallel to one another along the serpentine path (i.e., along the longitudinally-extending sections $35_1$-$35_7$ and the looping sections $38_1$-$38_6$). The first end 30 is located at the longitudinally-extending section $35_1$ and the second end 32 is located at the longitudinally-extending section $35_7$ such that the first end 30 and the second end 32 are located at the laterally furthest-most of the longitudinally-extending sections $35_1$-$35_7$ respectively (i.e., the longitudinally-extending sections $35_1$-$35_7$ which are most laterally spaced from one another).

Each of the channels 34, 36 defines a sinusoidal pattern along a majority of a span thereof. That is, each one of the channels 34, 36 has a repetitive pattern approximating that of a sinusoidal function along at least half of the span of that channel 34, 36. In this case, the sinusoidal pattern is defined along the longitudinally-extending sections $35_1$-$35_7$ of the serpentine path of the lower fluid conduit 26. The sinusoidal pattern defined by the channels 34, 36 changes a direction of the flow of water within the channels 34, 36 as the flow of water engages the curves defined by the sinusoidal pattern. Moreover, it is noted that the channels 34, 36 have a constant width (i.e., a distance between the opposite walls of each of the channels 34, 36 is uniform along a span thereof) as their width is unaffected by the curves defined by the sinusoidal pattern. In particular, in this embodiment, the width of each of the channels 34, 36 is 2 mm. In other embodiments, the width of the channels of each of the channels 34, 36 may be between 1 mm and 4 mm. The channels 34, 36 may have any other suitable dimensions in other embodiments so long as it is convenient for the flow regime within the channels 34, 36 and easily machinable such as with a machine tool having a rotary cutter (e.g., a mill or a router).

A more detailed description of the path described by the lower fluid conduit 26 can be found in European Patent Application 18315027.5, filed Sep. 4, 2018, which is incorporated herein by reference. Alternative configurations of the path of the lower fluid conduit 26 are also described therein. It is contemplated that the lower fluid conduit 26 could have any other suitable path configuration in other embodiments.

The lower plate member 100 is a largest of the generally rectangular plate members 100, 200, 300. Notably, as shown in FIG. 6, the lower plate member 100 has a width W1, measured between opposite lateral ends $23_1$, $23_2$ of the lower plate member 100, and a length L1, measured between opposite longitudinal ends $21_1$, $21_2$ of the lower plate member 100, that are respectively greater than the widths W2, W3 and lengths L2, L3 of the upper and intermediate members 200, 300. The dimensions of the lower plate member 100 are made larger so that, as will be described below, the lower plate member 100 can receive the full width and length of the intermediate member 300 (i.e., the intermediate plate member 300 can fit within the width W1 and length L1 of the lower plate member 100).

In this embodiment, the intermediate plate member 300 defines a cover portion 165 of the lower water block unit 12 as well as a base portion 175 of the upper water block unit 14. The intermediate plate member 300 is disposed atop the lower plate member 100 such that, together, the base portion 150 and the cover portion 165 defined by the lower and intermediate plate members 100, 300 collaborate to form the lower water block unit 12.

Figure 8:
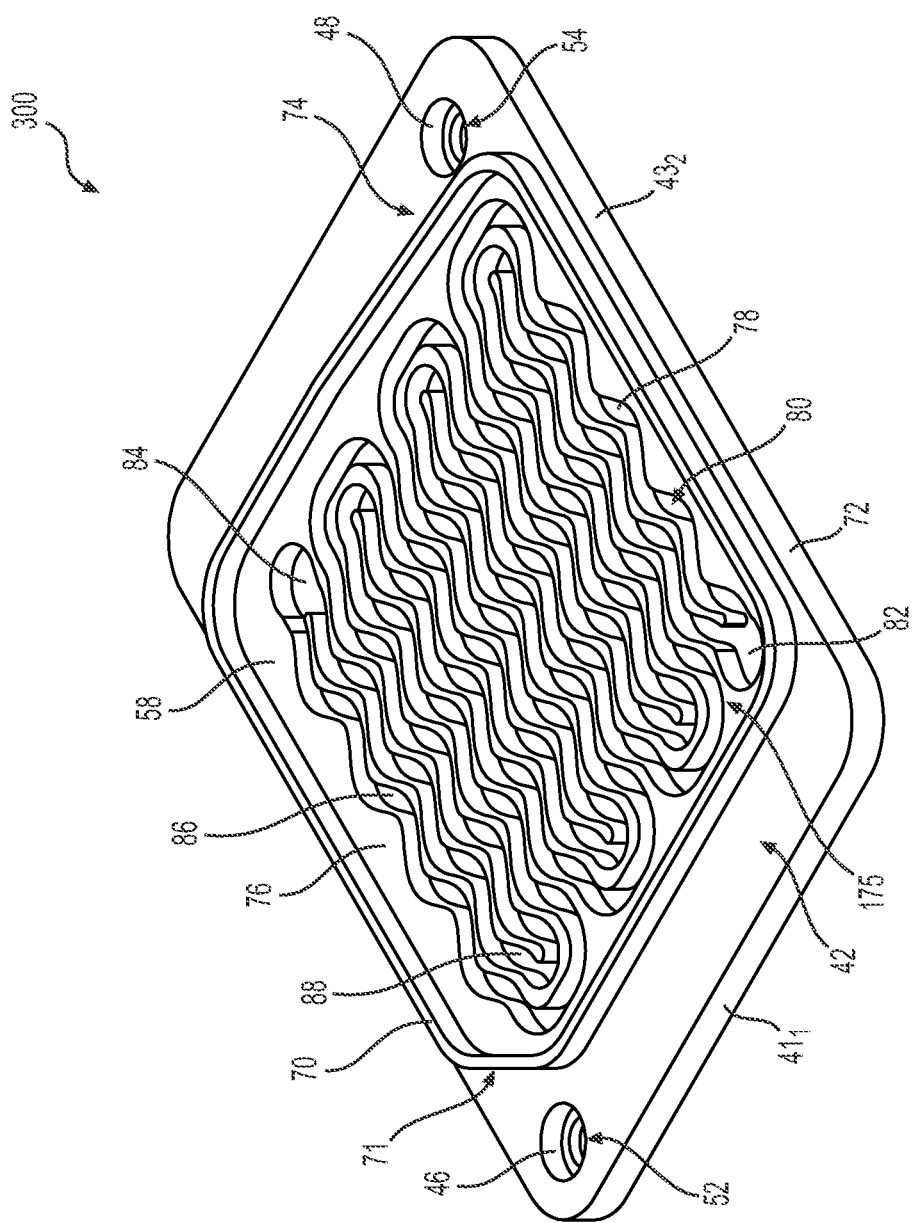
FIG. 8 is a perspective view of an intermediate plate member of the water block assembly of FIG. 1.
Figure 9:
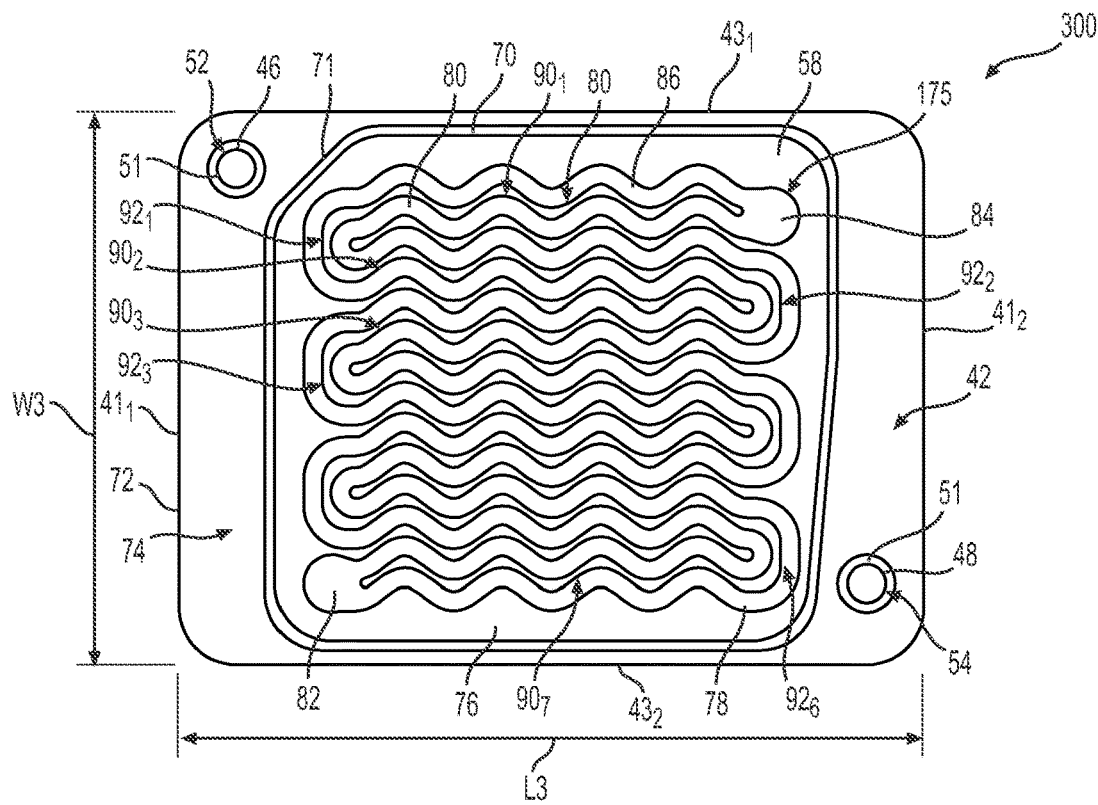
FIG. 9 is a top plan view of the intermediate plate member of FIG. 8.
Figure 10:
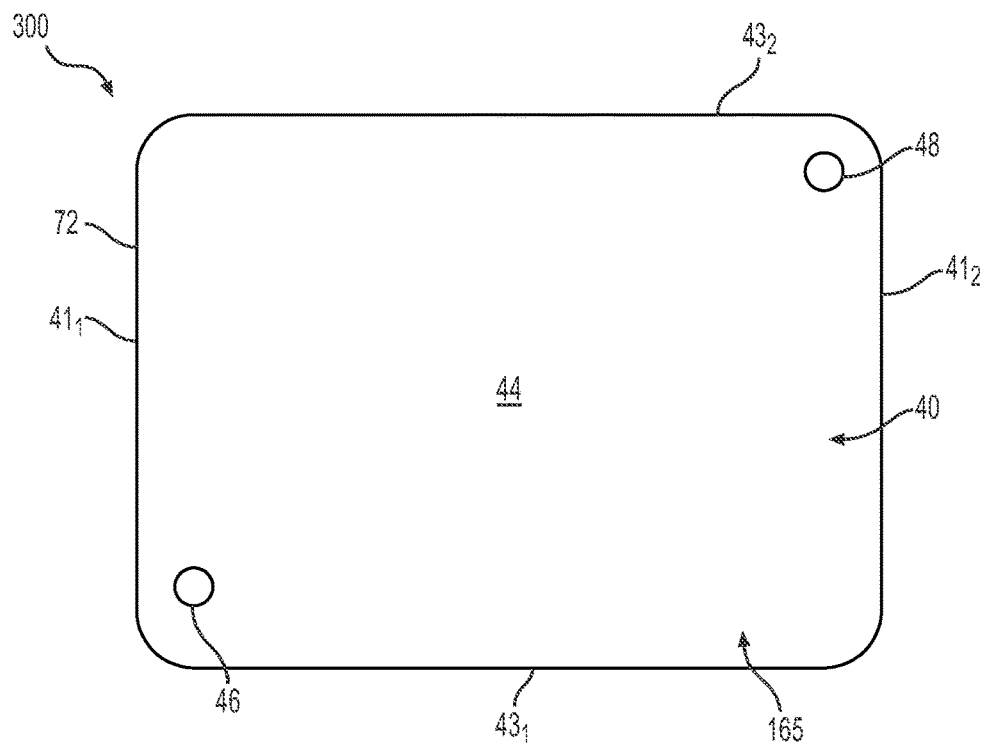
FIG. 10 is a bottom plan view of the intermediate plate member of FIG. 8.

With reference to FIGS. 8 to 10, the intermediate plate member 300 has a lower side 40 and an upper side 42 opposite the lower side 40. The intermediate plate member 300 has a width W3, measured between opposite lateral ends $43_1$, $43_2$ of the intermediate plate member 300, and a length L3, measured between opposite longitudinal ends $41_1$, $41_2$ of the intermediate plate member 300, which, as mentioned above, are smaller than the width W1 and length L1 of the lower plate member 100.

As shown in FIG. 10, the intermediate plate member 300 has a planar lower surface 44 defined on the lower side 40. The intermediate member 300 also defines openings 46, 48 which traverse the intermediate plate member 300 from the upper side 42 to the lower side 40. The openings 46, 48 are, in this embodiment, located at diagonally opposite corners of the intermediate plate member 300. Notably, the opening 46 is located adjacent an intersection of the longitudinal end $41_1$ and the lateral end $43_1$, while the opening 48 is located adjacent an intersection of the longitudinal end $41_2$ and the lateral end $43_2$. As such, when the intermediate plate member 300 is placed atop the lower plate member 100, the openings 46, 48 are generally aligned with the first and second ends 30, 32 respectively. Notably, the openings 46, 48 define a fluid inlet 52 and a fluid outlet 54 of the lower fluid conduit 26 of the lower water block unit 12 which are provided for feeding and discharging fluid from the lower fluid conduit 26 of the lower water block unit 12 respectively. The openings 46, 48 are counterbored such that each of the openings 46, 48 defines a respective shoulder 51 (FIG. 9) facing the upper side 42 such as to provide an abutment for tubes 60, 62 which are connected to the openings 46, 48.

As will be understood, in this embodiment, the lower side 40 of the intermediate plate member 300 and the fluid inlet 52 and the fluid outlet 54 define the cover portion 165 of the lower water block unit 12 which collaborates with the base portion 150 to form the lower water block unit 12.

It is contemplated that, in alternative embodiments, as shown in FIG. 15, the lower surface 44 on the lower side 40 of the intermediate plate member 300 (i.e., the cover portion 165) could define a recess 75 complementary to the recess 28 of the lower plate member 100 such that the recesses 28, 75 collaborate with one another to define the lower fluid conduit 26. Notably, in such an embodiment, the recess 75 is a mirror image of the recess 28 and will thus not be described in detail here. It is noted that the openings 46, 48 are located at the ends of the recess 75 in such an embodiment. The inclusion of the recess 75 could improve the cooling capacity of the water block assembly 10 as the contact surface area between the lower fluid conduit 26 and the intermediate plate member 300 would be greater and thus improve heat transfer distribution.

Figure 16A:
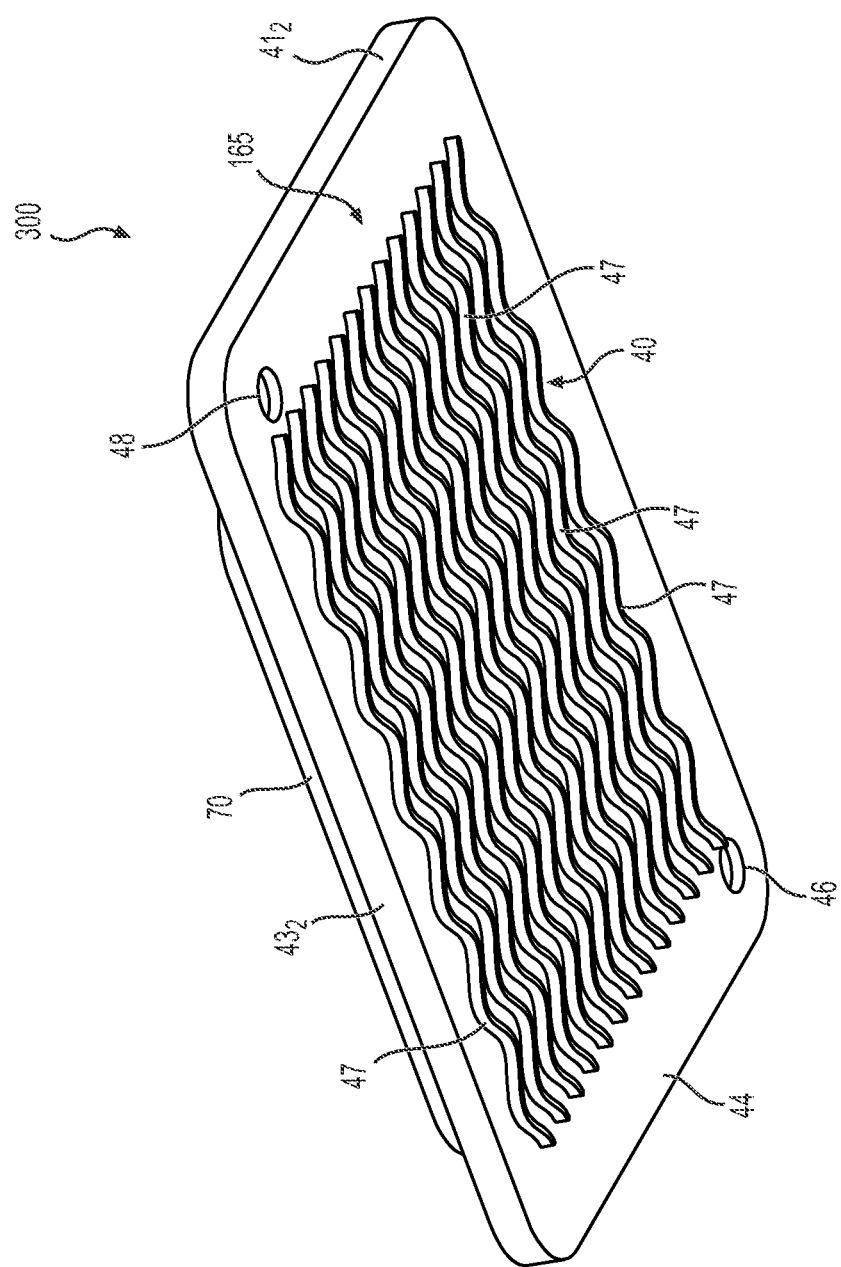
FIG. 16A is a perspective view, taken from a bottom side, of the intermediate plate member in accordance with another alternative embodiment.
Figure 16B:
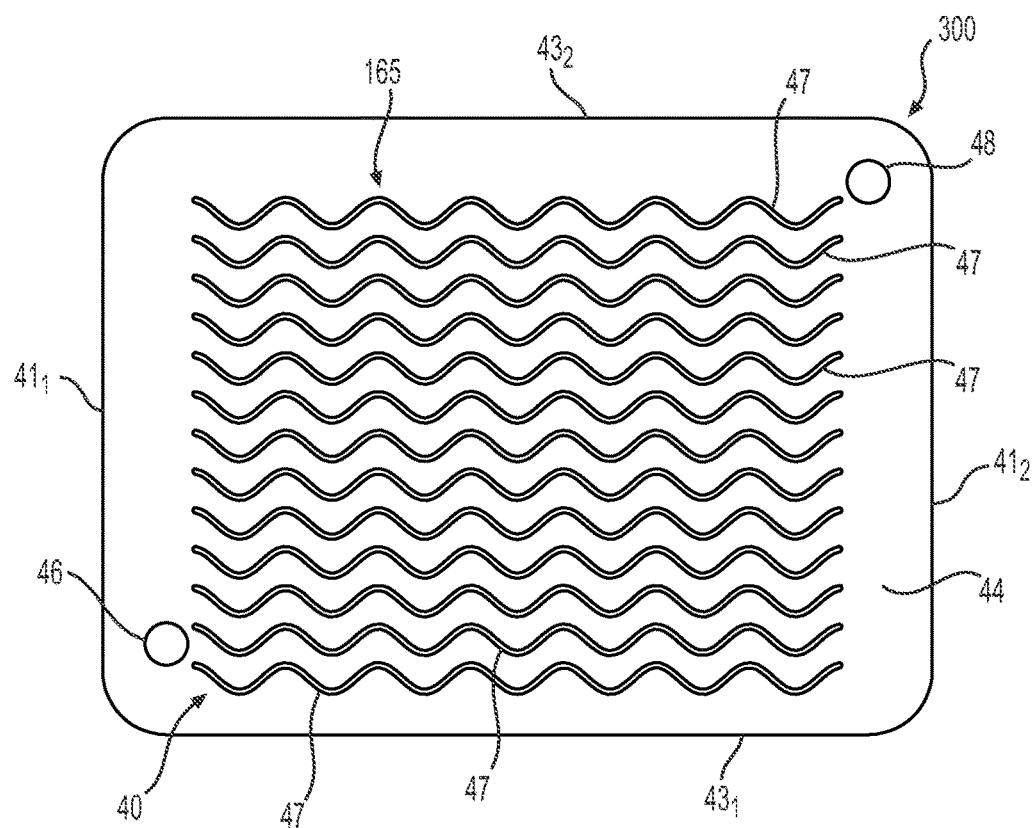
FIG. 16B is a bottom plan view of the intermediate plate member of FIG. 16A.
Figure 16C:
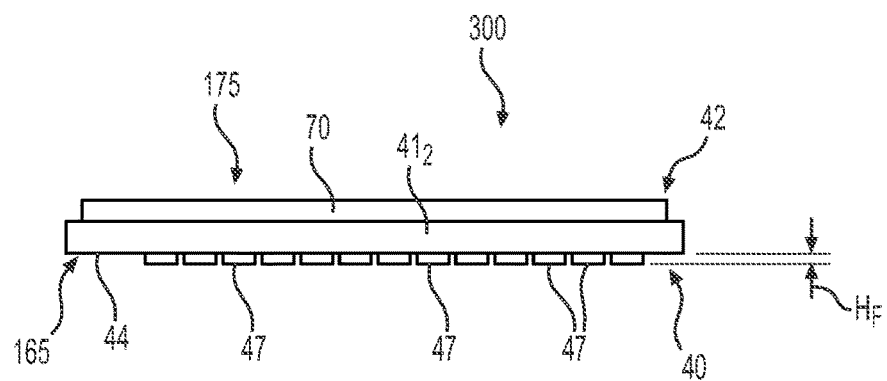
FIG. 16C is a side elevation view of the intermediate plate member of FIG. 16A.

In yet other embodiments, with reference to FIGS. 16A to 16C, the lower side 40 of the intermediate plate member 300 (i.e., the cover portion 165) is provided with fins 47 projecting downwardly from the lower surface 44 toward the lower plate member 100. The fins 47 are configured such that, when the intermediate plate member 300 is in position on the lower plate member 100, the fins 47 are received within the recess 28 of the lower plate member 100. Notably, each of the fins 47 is received within one of the channels 34, 36 at respective ones of the longitudinally-extending sections $35_1$-$35_7$. As such, in this embodiment, each of the fins 47 defines a sinusoidal pattern and extends generally longitudinally. A height $H_F$ of the fins 47, shown in FIG. 16C, is approximately 1 mm in this embodiment. A cross-sectional thickness of each of the fins 47 is approximately 0.5 mm. The fins 47 may improve the cooling capacity of the water block assembly 10 as the contact surface area between the lower fluid conduit 26 and the intermediate plate member 300 would be greater and thus improve heat transfer distribution. Moreover, in case of blockage in the lower fluid conduit 26, natural convection between the fluid conduit 26 and the intermediate plate member 300 is improved by the fins 47 in comparison with a flat lower surface 44, thus facilitating the upper fluid conduit 80 of the upper water block unit 14 dissipate the heat from the target component 50.

On its upper side 42, as shown in FIG. 9, the intermediate plate member 300 has a pocket 58 surrounded by a locating rim 70 which helps locate the upper plate member 200 on the intermediate plate member 300 and into the pocket 58. The pocket 58 is configured to receive the upper plate member 200. In this embodiment, the pocket 58 is generally rectangular with rounded corners, except for one corner thereof which is truncated. In particular, the internal face of the locating rim 70 and the peripheral edge of the upper plate member 200 have complementary shapes so that the locating rim 70 is designed to partly surround the peripheral edge of the upper plate member 200. Notably, in this embodiment, the truncated corner 71 is an orientation feature of the intermediate plate member 300 which helps orient the upper plate member 200 relative to the intermediate plate member 300. As will be explained further below, the upper plate member 200 has a corresponding orientation feature. Furthermore, it is noted that while not illustrated in this embodiment, the lower plate member 100 could optionally have a similar orientation feature to help orient the intermediate plate member 300 relative to the lower plate member 100. In addition to helping orient the upper plate member 200 relative to the intermediate plate member 300, the truncated corner 71 also provides space for the opening 46 such that the locating rim 70 is clear thereof. A portion 73 of the opposite longitudinal side of the locating rim 70 (see FIGS. 12, 13) is also angled to be clear of the opening 48. As such, the dimensions of the upper plate member 200, which is received in the pocket 58, can be maximized which in turn maximizes the heat transfer interface between the lower and upper water block units 12, 14.

In this embodiment, to improve efficiency of the water block assembly 10, the pocket 58 defined by the locating rim 70 extends along a significant portion of the upper side 42 of the intermediate plate member 300 such that the upper plate member 200 (which is received in the pocket 58) covers a significant portion of the intermediate plate member 300. Notably, this can improve heat distribution between the lower and upper water block units 12, 14. For instance, in this embodiment, the pocket 58 extends along at least 85% of the surface area of the upper side 42 of the intermediate plate member 300.

An outer periphery 72 of the intermediate plate member 300 (including the longitudinal ends $41_1$, $41_2$ and lateral ends longitudinal ends $43_1$, $43_2$) is defined by an outer portion 74 that extends outwardly from the locating rim 70. In this embodiment, the outer portion 74 extends longitudinally outward from the locating rim 70 in a first longitudinal direction and a second longitudinal direction opposite the first longitudinal direction. Moreover, in this embodiment, the outer portion 74 also extends laterally outward from the locating rim 70 in a first lateral direction and a second lateral direction opposite the first lateral direction. As such, in this embodiment, the outer portion 74 surrounds the locating rim 70. As shown in FIG. 9, the openings 46, 48 which define the fluid inlet 52 and fluid outlet 54 are defined in the outer portion 74 and, more specifically, in a section of the outer portion 74 that extends longitudinally outward from the locating rim 70. Notably, the openings 46, 48 are defined on opposite longitudinal sides of the locating rim 70.

The pocket 58 has the same shape as the locating rim 70 and thus is generally rectangular with rounded corners, except for one corner thereof which is truncated (corresponding to the truncated corner 71 of the locating rim 70). The pocket 58 defines an upper surface 76 of the intermediate plate member 300. The upper surface 76 defines a continuous recess 78 which partly defines a fluid conduit 80 of the upper water block unit 14. The fluid conduit 80 will thus be referred to as the "upper" fluid conduit 80. The upper fluid conduit 80 extends from a first end 82 to a second end 84 which correspond to first and second ends of the recess 78. The first and second ends 82, 84 of the upper fluid conduit 80 are located at diagonally opposite corners of the pocket 58. More particularly, the first end 82 is located proximate an intersection of the longitudinal end $41_1$ and the lateral end $43_2$ of the intermediate plate member 300, while the second end 84 is located proximate an intersection of the longitudinal end $41_2$ and the lateral end $43_1$ of the intermediate plate member 300. As such, the first and second ends 82, 84 are located proximate opposite longitudinal and lateral sides of the water block assembly 10.

In this embodiment, the recess 78 is machined into the upper surface 76 of the intermediate plate member 300 in a manner similar to the recess 28 described above.

The path defined by the upper fluid conduit 80, as defined by the recess 78, begins at the first end 82. As with the lower fluid conduit 26, the upper fluid conduit 80 branches into two channels 86, 88 at the first end 82 such that the flow of fluid within the upper fluid conduit 80 is split between both channels 86, 88. The channels 86, 88 extend parallel to one another along at least a majority of a span of the upper fluid conduit 80. More specifically, in this embodiment, the channels 86, 88 extend parallel and adjacent to one another from the first end 82 to the second end 84. As will be described further below, the channels 86, 88 merge together again at the second end 84. However, in the span of the upper fluid conduit 80 between the first end 82 and the second end 84, the channels 86, 88 are fluidly separate from one another such that water flow from both channels 86, 88 does not mix until reaching the second end 84.

Similarly, it is contemplated that, in alternative embodiments, the upper fluid conduit 80 could branch into more than two channels. Moreover, it is contemplated that the junction at which the upper fluid conduit 80 branches into the two or more channels could be downstream from the first end 82, and similarly that the junction at which the two channels 86, 88 merge together could be upstream from the second end 84.

As can be seen in FIG. 9, the upper fluid conduit 80 also forms a serpentine path such that the upper fluid conduit 80 defines a plurality of longitudinally-extending sections $90_1$-$90_7$ that are parallel to one another and are laterally spaced from one another, with adjacent ones of the longitudinally-extending sections $90_1$-$90_7$ being connected by looping sections $92_1$-$92_6$. As the serpentine path has been described with respect to the lower fluid conduit 26, it will not be described here again. Moreover, similarly to the channels 34, 36, each of the channels 86, 88 also defines a sinusoidal pattern. The sinusoidal pattern of the channels 86, 88 will not be described as reference can be made to that which was described with respect to the channels 34, 36 of the lower fluid conduit 26.

As will be understood, in this embodiment, the upper side 42 of the intermediate plate member 300, including the locating rim 70 and the recess 78, defines the base portion 175 of the upper water block unit 14 which collaborates with a cover portion 180 defined by the upper plate member 200 to form the upper water block unit 14. As such, the intermediate plate member 300 defines a portion of each of the lower and upper water block units 12, 14, notably the cover portion 165 of the lower water block unit 12 and the base portion 175 of the upper water block unit 14. As such, in this embodiment, a heat transfer interface between the cover portion 165 and the base portion 175 is constituted by the material of the intermedia plate member 300.

The upper plate member 200, which defines the cover portion 180 of the upper water block unit 14, is disposed atop the intermediate plate member 300 such that, together, the base portion 175 and the cover portion 180 defined by the intermediate and upper plate members 300, 200 collaborate to form the upper water block unit 14.

Figure 11:
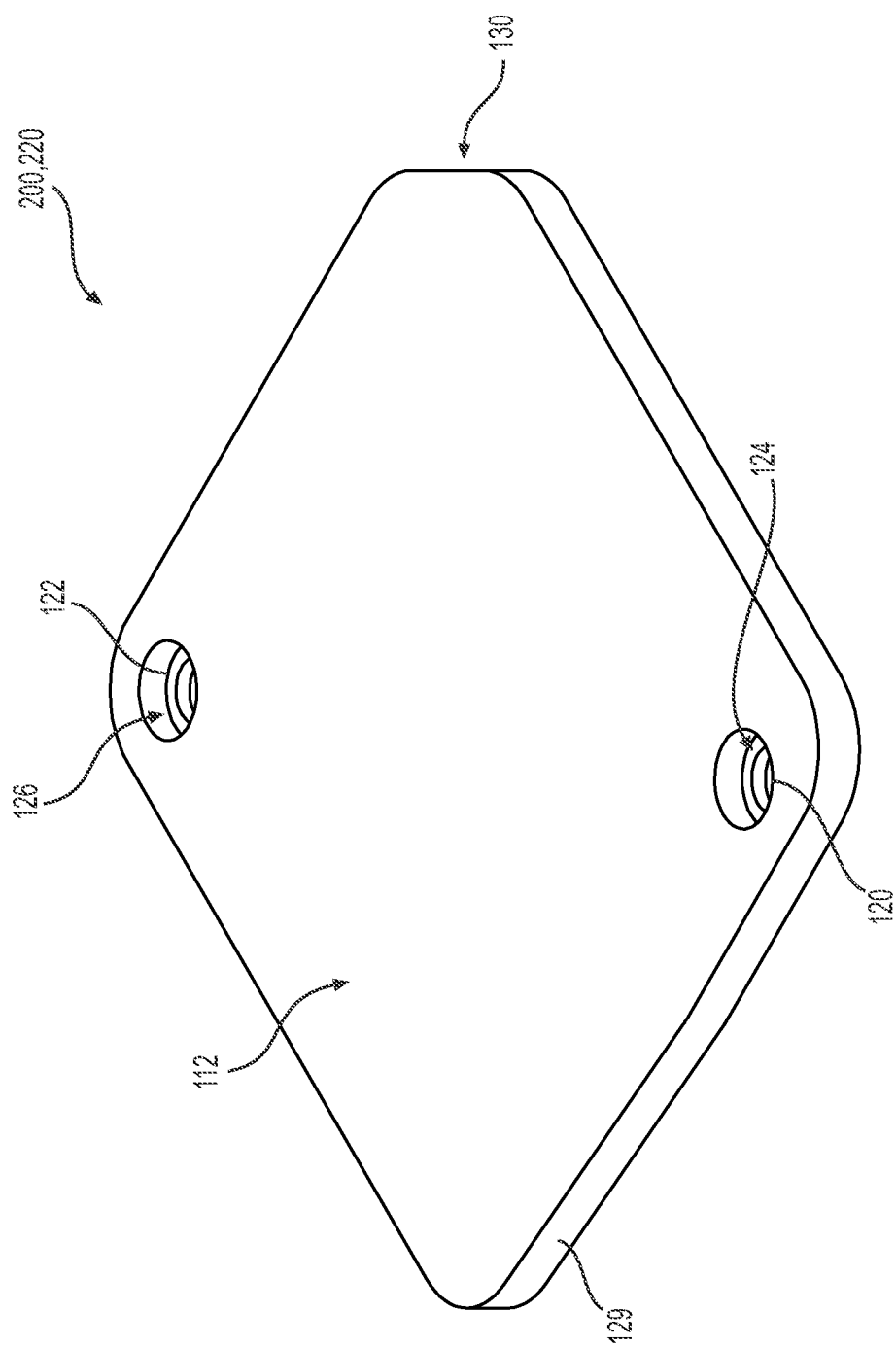
FIG. 11 is a perspective view of an upper plate member of the water block assembly of FIG. 1.
Figure 12:
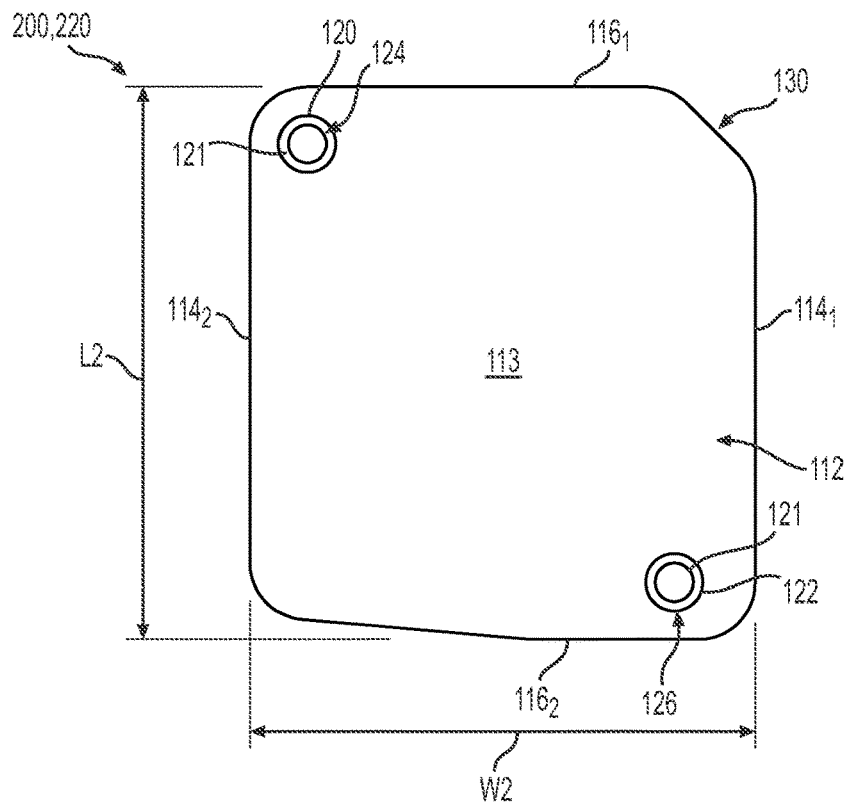
FIG. 12 is a top plan view of the upper plate member of FIG. 11.
Figure 13:
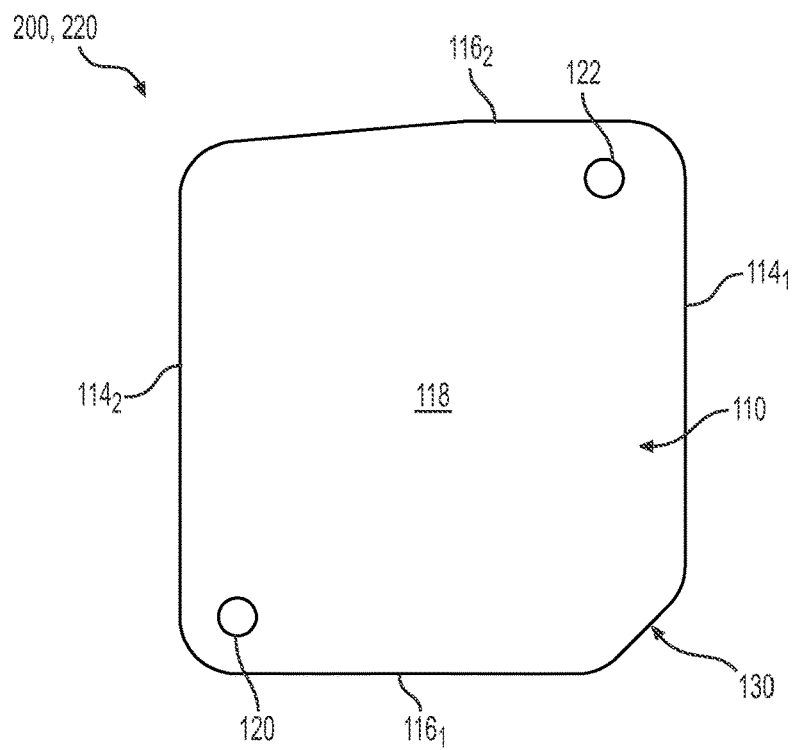
FIG. 13 is bottom plan view of the upper plate member of FIG. 11.

With reference to FIGS. 11 to 13, the upper plate member 200 has a lower side 110 and an upper side 112 opposite the lower side 110. The upper plate member 200 has a width W2 measured between opposite lateral ends $114_1$, $114_2$ of the upper plate member 200 and a length L2 measured between opposite longitudinal ends $116_1$, $116_2$ of the upper plate member 200. The width W2 and the length L2 of the upper plate member 200 are smaller than the width W3 and the length L3 of the intermediate plate member 300 so that the intermediate plate member 300 can receive the full width W2 and length L2 of the upper plate member 200 (i.e., the upper plate member 200 can fit within the width W3 and length L3 of the intermediate plate member 300).

As shown in FIG. 13, the upper plate member 200 has a planar lower surface 118 defined on the lower side 110. The upper plate member 200 also defines openings 120, 122 defined by a planar upper surface 113 of the upper side 112 and which traverse the upper plate member 200 from the upper side 112 to the lower side 110. The openings 120, 122 are located at diagonally opposite corners of the upper plate member 200. Notably, the opening 120 is located adjacent an intersection of the longitudinal end $116_1$ and the lateral end $114_2$, while the opening 122 is located adjacent an intersection of the longitudinal end $116_2$ and the lateral end $114_1$. As such, when the upper plate member 200 is placed atop the intermediate plate member 300, the openings 120, 122 are generally aligned with the first and second ends 82, 84 respectively. Notably, the openings 120, 122 define a fluid inlet 124 and a fluid outlet 126 of the upper fluid conduit 80 of the upper water block unit 14 which are provided for feeding and discharging fluid from the upper fluid conduit 80 of the upper water block unit 14 respectively. The openings 120, 122 are counterbored such that each of the openings 120, 122 defines a respective shoulder 121 (FIG. 12) facing the upper side 112 such as to provide an abutment for tubes 64, 66 which are connected to the openings 120, 122.

It is contemplated that, in alternative embodiments, the lower side 110 of the upper plate member 200 could define a recess complementary to the recess 78 of the intermediate plate member 300 such that both recesses collaborate with one another to define the upper fluid conduit 80. Notably, in such an embodiment, the recess of the upper plate member 200 could be a mirror image of the recess 78 and will thus not be described in detail here. It is noted that the openings 120, 122 are located at the ends of the recess of the upper plate member 200 in such an embodiment.

The manner in which the lower, upper and intermediate plate members 100, 200, 300 are assembled to form the lower and upper water block units 12, 14 will now be described in detail.

As briefly mentioned above, the lower water block unit 12 is formed by the assembly of the base portion 150 and the cover portion 165 which, in this embodiment, are defined by the lower and intermediate plate members 100, 300 respectively. Thus, in this embodiment, the lower and intermediate plate members 100, 300 are affixed to one another to form the lower water block unit 12.

Figure 3:
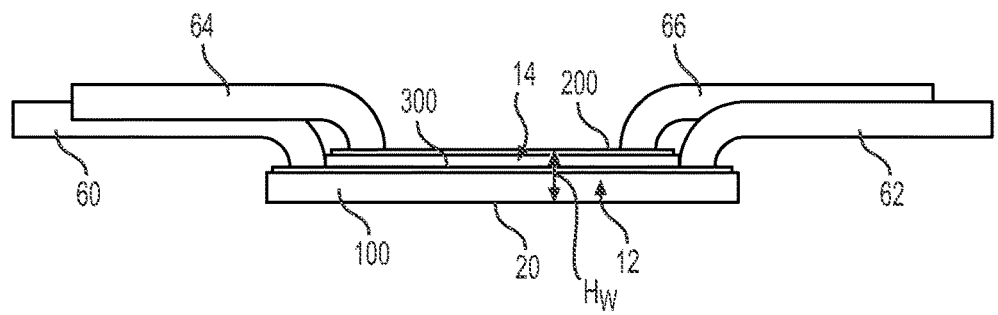
FIG. 3 is a side elevation view of the water block assembly of FIG. 1.

In order to install the intermediate plate member 300 on the lower plate member 100, the fluid inlet 52 and the fluid outlet 54 defined by the intermediate plate member 300 are aligned with the first and second ends 30, 32 of the recess 28 respectively. The intermediate plate member 300 is then lowered onto the lower plate member 100 with the lower side 40 facing the lower plate member 100. The intermediate plate member 300 is received in the pocket 25 defined on the upper side 24 of the lower plate member 100. When the intermediate plate member 300 is in place on the lower plate member 100, the locating rim 27 surrounds part of the intermediate plate member 300, as shown in FIG. 3. To that end, the intermediate plate member 300 is made such that its outer periphery 72 has the same shape and adequate dimensions (width W3, length L3, and radius of corners of the outer periphery) to fit snuggly within the pocket 25 defined by the locating rim 27. Moreover, the planar lower surface 44 of the intermediate plate member 300 is mated with the upper surface 29 of the lower plate member 100. As such, the lower surface 44 of the intermediate plate member 300 covers the recess 28 such that, together, the recess 28 and the lower surface 44 define the lower fluid conduit 26 of the lower water block unit 12.

In alternative embodiments in which the lower side 40 of the intermediate plate member 300 defines the recess 75 (FIG. 15), as discussed above, the recesses 28, 75 are complementary to one another such that, together, the recesses 28, 75 form the lower fluid conduit 26.

Once the intermediate plate member 300 is in place on the lower plate member 100, the lower and intermediate plate members 100, 300 are affixed to one another. The lower and intermediate plate members 100, 300 can be affixed to one another in various ways. In this embodiment, the intermediate plate member 300 is welded to the lower plate member 100 along a seam between the outer periphery 72 of the intermediate plate member 300 and the locating rim 27 of the lower plate member 100. In particular, in this embodiment, the intermediate plate member 300 and the lower plate member 100 are laser welded to one another.

As briefly mentioned above, the upper water block unit 14 is formed by the assembly of the base portion 175 and the cover portion 180 which, in this embodiment, are defined by the intermediate and upper plate members 300, 200 respectively. Thus, in this embodiment, the intermediate and upper plate members 300, 200 are affixed to one another to form the upper water block unit 14.

In order to install the upper plate member 200 on the intermediate plate member 300, the fluid inlet 124 and the fluid outlet 126 defined by the upper plate member 200 are aligned with the first and second ends 82, 84 of the recess 78 respectively. To that end, in this embodiment, the truncated corner 130 of the upper plate member 200 is aligned with the truncated corner 71 of the locating rim 70 of the intermediate plate member 300 which ensures proper alignment of the upper plate member 200 relative to the intermediate plate member 300. The upper plate member 200 is then lowered onto the intermediate plate member 300 with the lower side 110 facing the intermediate plate member 300. The upper plate member 200 is received in the pocket 58 defined on the upper side 42 of the intermediate plate member 300. When the upper plate member 200 is in place on the intermediate plate member 300, the locating rim 70 surrounds part of the upper plate member 200, as shown in FIG. 3. To that end, the upper plate member 200 is made such that an outer periphery 129 of the upper plate member 200 has the same shape and adequate dimensions (width W2, length L2, and radius of corners of the outer periphery) to fit snuggly within the pocket 58 defined by the locating rim 70. Moreover, the planar lower surface 118 of the upper plate member 200 is mated with the upper surface 76 of the intermediate plate member 300. As such, the lower surface 118 of the upper plate member 200 covers the recess 78 such that, together, the recess 78 and the lower surface 118 define the upper fluid conduit 80 of the upper water block unit 14.

In alternative embodiments in which the lower side 110 of the upper plate member 200 defines a recess, as discussed above, the recess 78 and the recess of the upper plate member 200 are complementary to one another such that, together, the recesses form the upper fluid conduit 80.

Once the upper plate member 200 is in place on the intermediate plate member 300, the intermediate and upper plate members 300, 200 are affixed to one another. The intermediate and upper plate members 300, 200 can be affixed to one another in various ways. In this embodiment, the intermediate plate member 300 is welded to the upper plate member 200 along a seam between the outer periphery 129 of the upper plate member 200 and the locating rim 70 of the intermediate plate member 300. In particular, in this embodiment, the intermediate plate member 300 and the upper plate member 200 are laser welded to one another.

Figure 2:
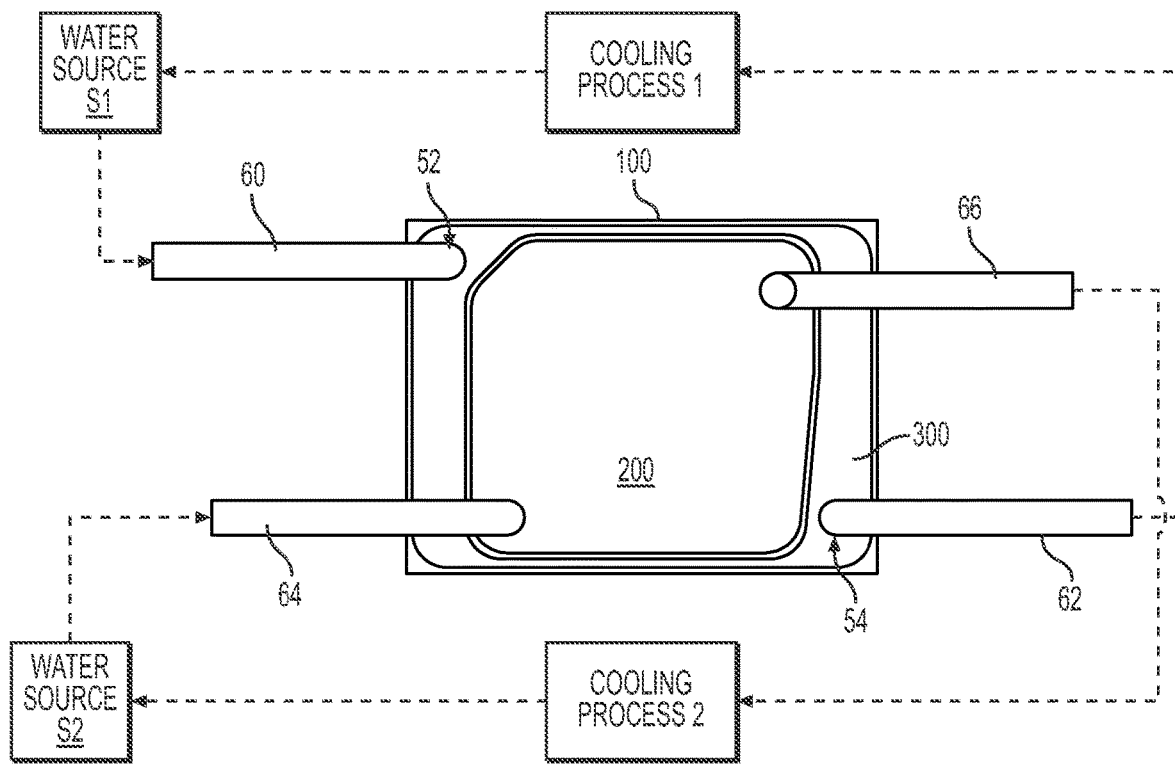
FIG. 2 is a top plan view of the water block assembly of FIG. 1.
Figure 4:
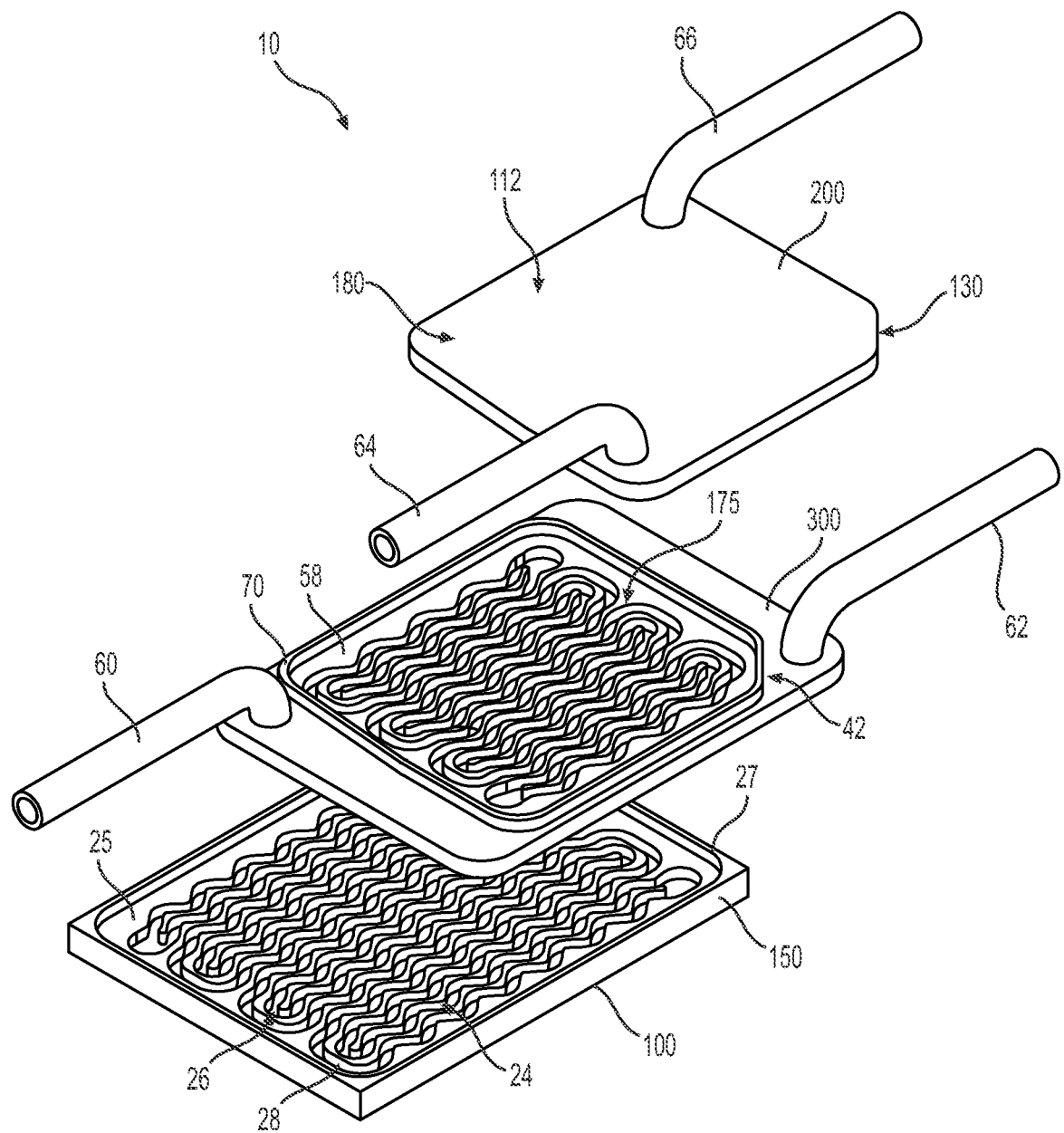
FIG. 4 is an exploded view of the water block assembly of FIG. 1.

The tubes 60, 62, 64, 66 are then installed at their respective locations. Notably, the tubes 60, 62 (FIG. 4) are installed at the fluid inlet 52 and the fluid outlet 54 respectively to feed water into and discharge water from the lower fluid conduit 26 of the lower water block unit 12. The tubes 60, 62, which are also made of copper, are affixed, namely welded, to the intermediate plate member 300. As shown schematically in FIG. 2, the tube 60 is fluidly connected to a cool fluid source S1 to provide cool fluid to the lower fluid conduit 26. In this embodiment, the fluid is water and thus the fluid source S1 is a water source. A pump (not shown) is also provided in fluid communication with the lower fluid conduit 26 to pump water into and out of the lower fluid conduit 26. For its part, the tube 62 is fluidly connected to a water tank which is fluidly connected to the pump. The discharged heated water from the tube 62 undergoes a cooling process before returning to the water source S1. The cooling process through which the water is cooled between the fluid outlet 54 and the fluid inlet 52, to obtain the cool water source S1, may vary and will not be described herein.

The tubes 64, 66 (FIG. 4) are installed at the fluid inlet 124 and the fluid outlet 126 respectively to feed water into and discharge water from the upper fluid conduit 80 of the upper water block unit 14. The tubes 64, 66, which are also made of copper, are affixed, namely welded, to the upper plate member 200. As shown schematically in FIG. 2, in this embodiment, the tube 64 is fluidly connected to a cool fluid source S2 to provide cool fluid to the upper fluid conduit 80. Thus, in this embodiment, the tubes 60, 64 are fluidly connected to different fluid sources 51, S2 such that the lower and upper fluid conduits 26, 80 operate on distinct fluid circuits. In this embodiment, the fluid is water and thus the fluid source S2 is a water source. A pump (not shown) is also provided in fluid communication with the upper fluid conduit 80 to pump water into and out of the upper fluid conduit 80. For its part, the tube 66 is fluidly connected to a water tank which is fluidly connected to the pump. The discharged heated water from the tube 66 undergoes a cooling process before returning to the water source S2. The cooling process through which the water is cooled between the fluid outlet 126 and the fluid inlet 124, to obtain the cool water source S2, may vary and will not be described herein.

While in this embodiment both the fluid sources 51, S2 are water sources, in some embodiments, the lower and upper water block units 12, 14 may operate on different fluids and thus the fluid sources 51, S2 may provide different fluids (e.g., water in one and oil in the other).

Figure 14A:
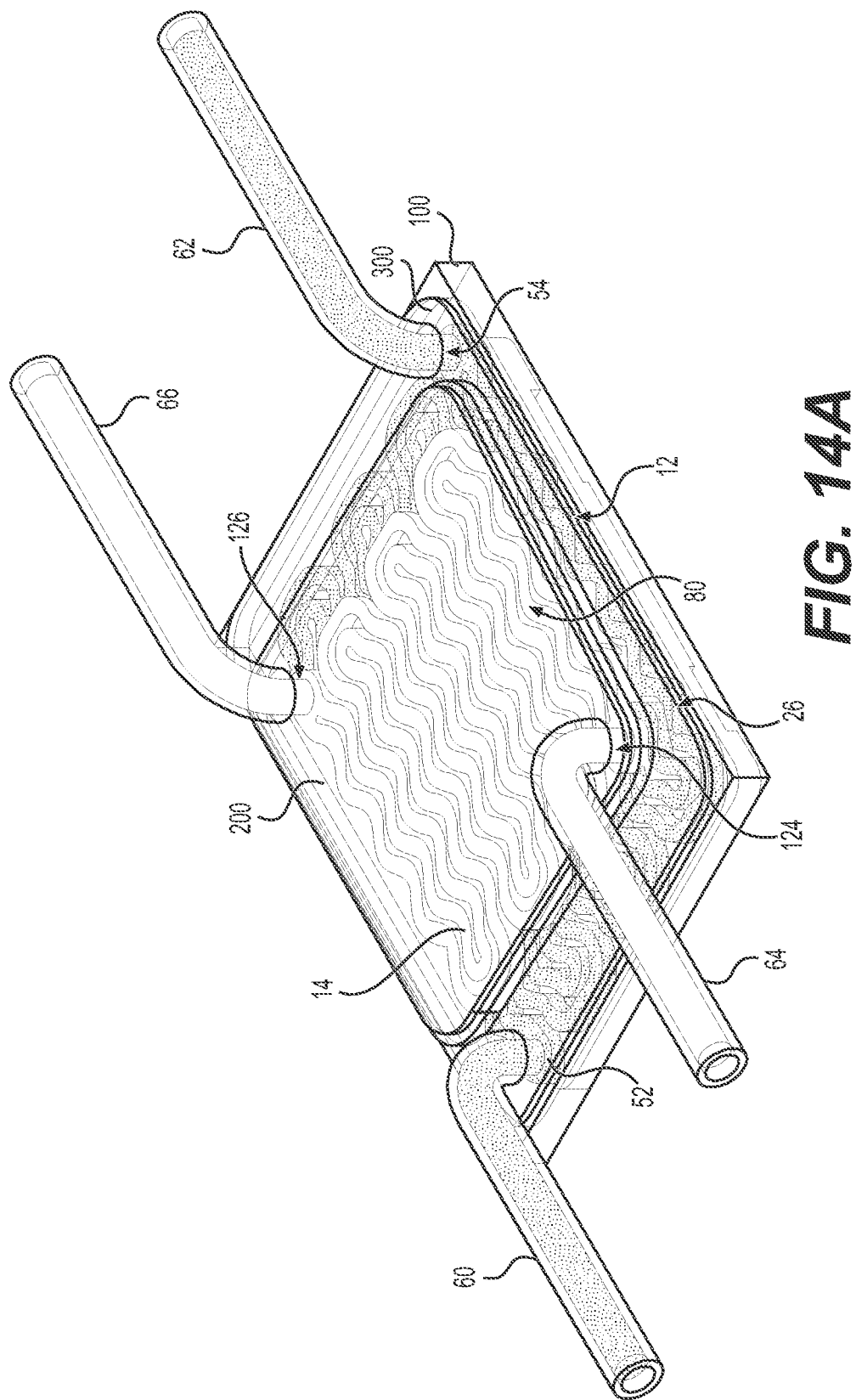
FIG. 14A is a perspective view of the water block assembly of FIG. 1, in which the plate members are shown in transparency to expose lower and upper fluid conduits of the water block assembly, with a target component to be cooled illustrated for reference.
Figure 14B:
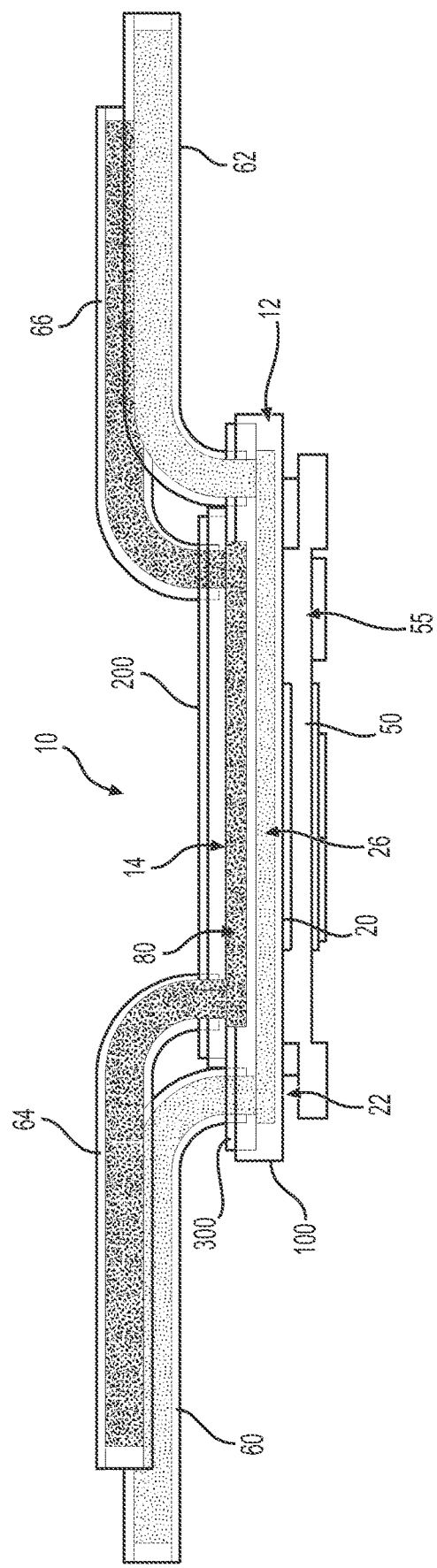
FIG. 14B is a side elevation view of the water block assembly of FIG. 14.

When the plate members 100, 200, 300 are assembled in this manner, the lower and upper water block units 12, 14 of the water block assembly 10 are formed having respective fluid conduits 26, 80 which are fed cooled fluid from the respective water source 51, S2. More particularly, in this embodiment, the fluid conduits 26, 80 are fluidly independent from one another (i.e., fluidly disconnected), as is best shown in FIGS. 14A and 14B. That is, the fluid conduits 26, 80 operate on separate fluid circuits such that water flowing through either of the lower or upper fluid conduits 26, 80 does not flow through the other of the lower and upper fluid conduits 26, 80. The disconnected operation of the lower and upper fluid conduits 26, 80 provides the water block assembly 10 with redundancy which can be helpful in the event that the lower fluid conduit 26 or the upper fluid conduit 80 experiences a decrease in performance, e.g., due to clogging, or even a pump failure. Notably, if the lower fluid conduit 26 were to get clogged such that water flow therethrough were decreased, the capability of the lower water block unit 12 to dissipate heat from the target component 50 would be diminished. However, since, in this embodiment, the upper water block unit 14 operates on a different fluid circuit than the lower water block unit 12, water flow through the upper fluid conduit 80 of the upper water block unit 14 remains unaffected by the clogging in the lower fluid conduit 26. As such, even if the lower fluid conduit 26 were fully clogged such that water flow in the lower fluid conduit 26 were to diminish to zero, the target component 50 is still cooled by the unaffected water flow in the upper fluid conduit 80 of the upper water block unit 14. More particularly, heat is transferred from the target component 50 to the lower water block unit 12 even though it is "inactive" (i.e., no water flow). Notably, when the lower water block unit 12 is inactive, heat is transferred from the lower water block unit 12 to the upper water block unit 14 via the locating rim 27, the upper surface 29 and the walls of the recess 28 which are all in thermal contact with the cover portion 165 defined by the intermediate plate member 300. As the intermediate plate member 300 also defines the base portion 175, heat is transferred from the cover portion 165 to the base portion 175 via the material of the intermediate plate member 300. In turn, the upper water block unit 14 releases the heat from the water block assembly 10 via the water flow through the upper fluid conduit 80. In this case, while the temperature of the target component 50 may still rise compared to if the lower water block unit 12 were operational, the temperature of the target component 50 will not rise as much as it would if the lower water block unit 12 were to experience this same diminished performance without the redundancy offered by the upper water block unit 14.

The integration of the cover portion 165 and the base portion 175 in the intermediate plate member 300 is helpful in ensuring efficient heat transfer between the lower and upper water block units 12, 14. Notably, since the cover portion 165 and the base portion 175 are defined by a single plate member, heat can be efficiently transferred through the relatively thin thermally conducting material of that plate member from the lower water block unit 12 to the upper water block unit 14. This can be particularly helpful when the lower water block unit 12 is subject to decreased performance (e.g., due to clogging or pump failure). Furthermore, in addition to reducing associated costs of manufacturing the water block assembly 10, the integration of the cover portion 165 and the base portion 175 in the intermediate plate member 300 makes the water block assembly 10 compact which can be particularly helpful in certain applications, namely in data centers which store a multitude servers (each having heat-generating components) and where space is limited. For example, a total height $H_w$ of the water block assembly 10 (shown in FIG. 3), measured from the external lower surface 20 of the lower plate member 100 (i.e., bottom surface of the lower water block unit 12) to a top surface of the upper plate member 200 (i.e., top surface of the upper water block unit 14) may be between 7 mm and 17 mm. In this embodiment, the total height $H_w$ of the water block assembly 10 is approximately 9 mm.

Figure 17:
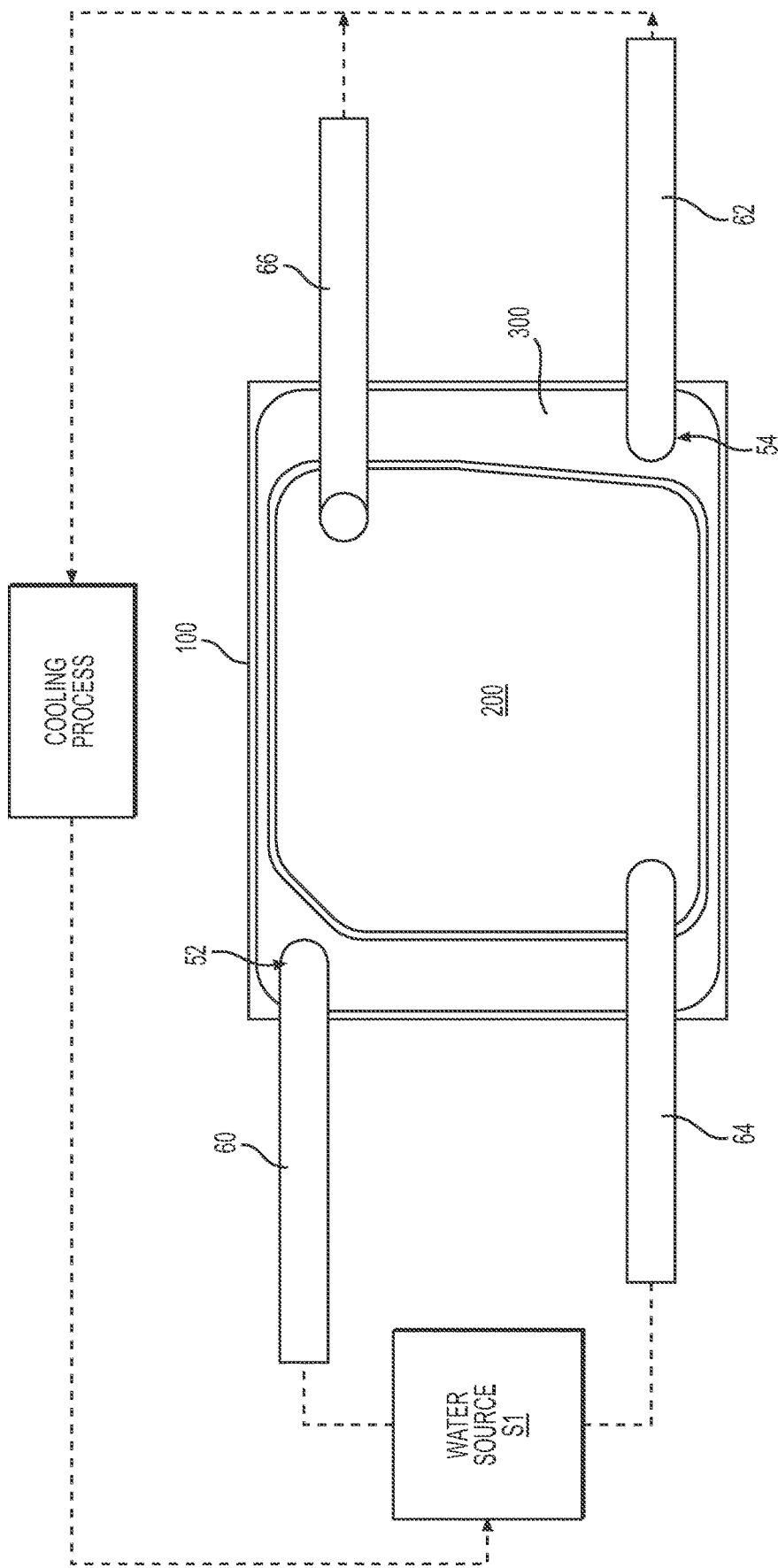
FIG. 17 is a top plan view of the water block assembly in accordance with another embodiment in which the lower and upper fluid conduits operate on a common fluid circuit.
Figure 18:
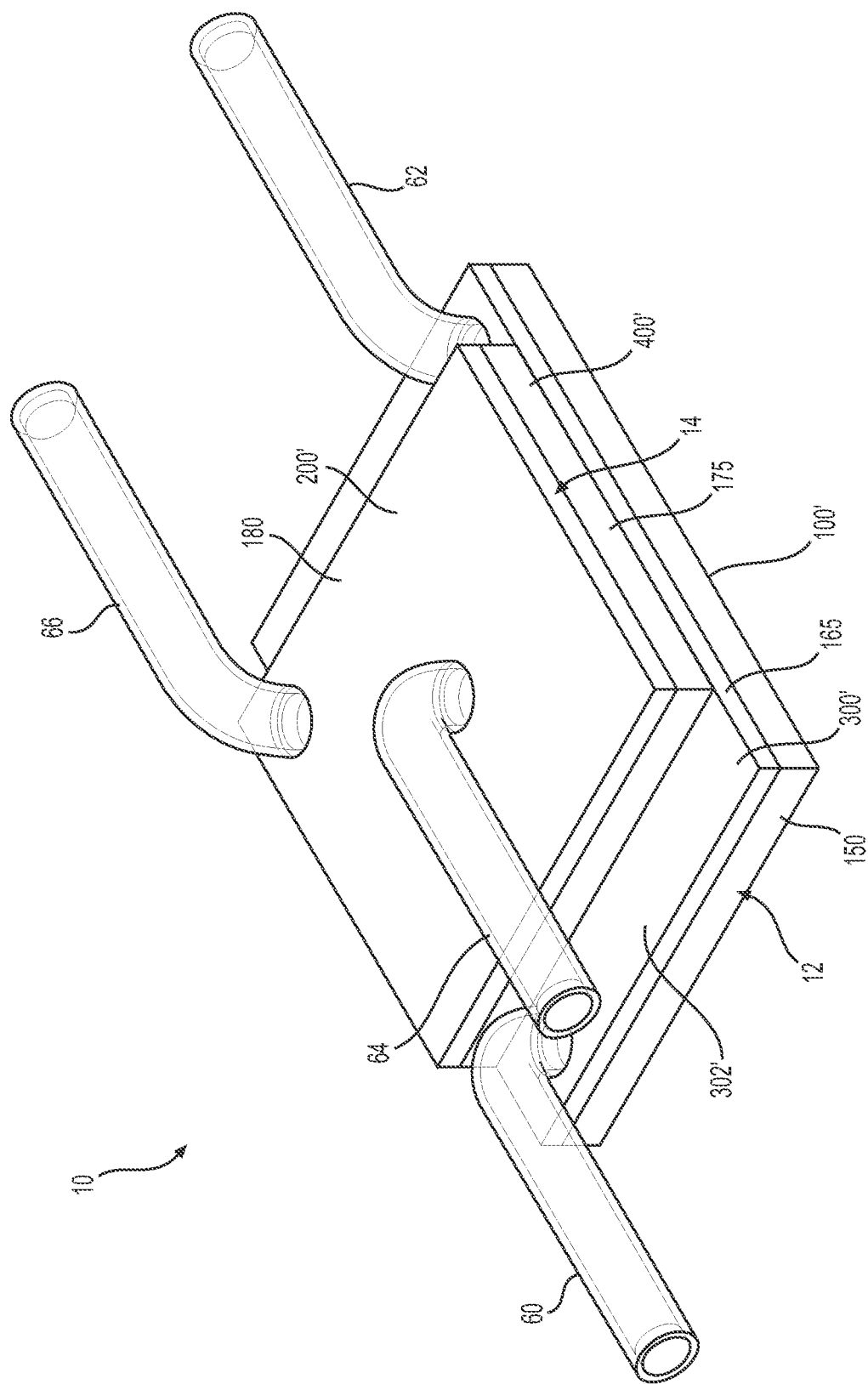
FIG. 18 is a perspective view of a water block assembly in accordance with an alternative embodiment.
Figure 19:
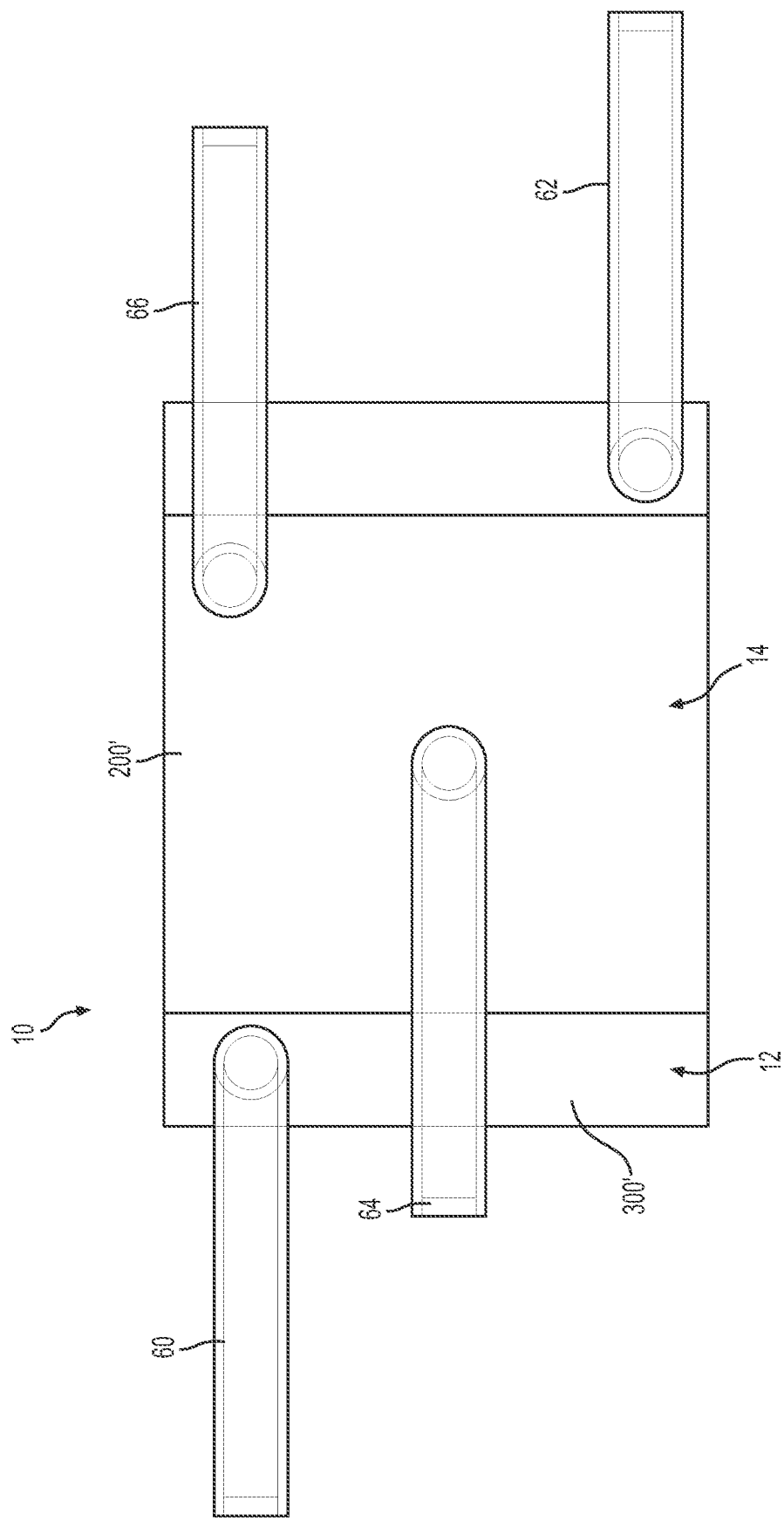
FIG. 19 is a top plan view of the water block assembly of FIG. 18.

In some embodiments, as shown in FIG. 17, the tubes 60, 64 may be fluidly connected to the same water source such that the lower and upper fluid conduits 26, 80 operate in parallel on the same fluid circuit. For example, the tubes 60, 64 may be connected to the water source S1. Thus, in such cases, the lower and upper fluid conduits 26, 80 are fed cooled water by the water source S1, and once water circulates through each of the lower and upper fluid conduits 26, 80 (in parallel), the heated water discharged by the lower and upper fluid conduits 26, 80 through their respective fluid outlets 54, 126 is cooled via a cooling process and then routed back to the water source S1. In such embodiments in which the lower and upper fluid conduits 26, 80 of the lower and upper water block units 12, 14 are integrated within a same fluid circuit, redundancy is still partially fulfilled since the upper water block unit 14 and its upper fluid conduit 80 would ensure the heat dissipation in case of clogging in the lower fluid conduit 26 and vice-versa. It is understood however that the redundancy in this embodiment is more limited since a failure in the broader circuit (e.g., at the water source 51, at the pump of the circuit, or the cooling system) would affect both fluid conduits 26, 80.

In other alternative embodiments in which the lower and upper fluid conduits 26, 80 of the lower and upper water block units 12, 14 are integrated within a same fluid circuit, the fluid conduits 26, 80 could operate in series such that fluid could first enter into the upper fluid conduit 80 through the fluid inlet 124, then enter into the lower fluid conduit 26 and exit through the fluid outlet 54. In this case, the redundancy is not ensured, but efficiency could be increased. The fluid outlet 126 is then fluidly connected to the fluid inlet 52. In such an embodiment, the fluid outlet 126 and the fluid inlet 52 could also be aligned in such a way that there are no more tubes between them, the fluid inlet 52 being located inside the pocket 58 of the intermediate plate member 300.

FIGS. 18 to 25 show another embodiment of the water block assembly 10. In this embodiment, rather than including three plate members, the water block assembly 10 includes four plate members to form the lower and upper water block units 12, 14. Notably, in this embodiment, the water block assembly 10 includes a lower plate member 100', a first intermediate plate member 300', a second intermediate plate member 400' and an upper plate member 200'.

Figure 20:
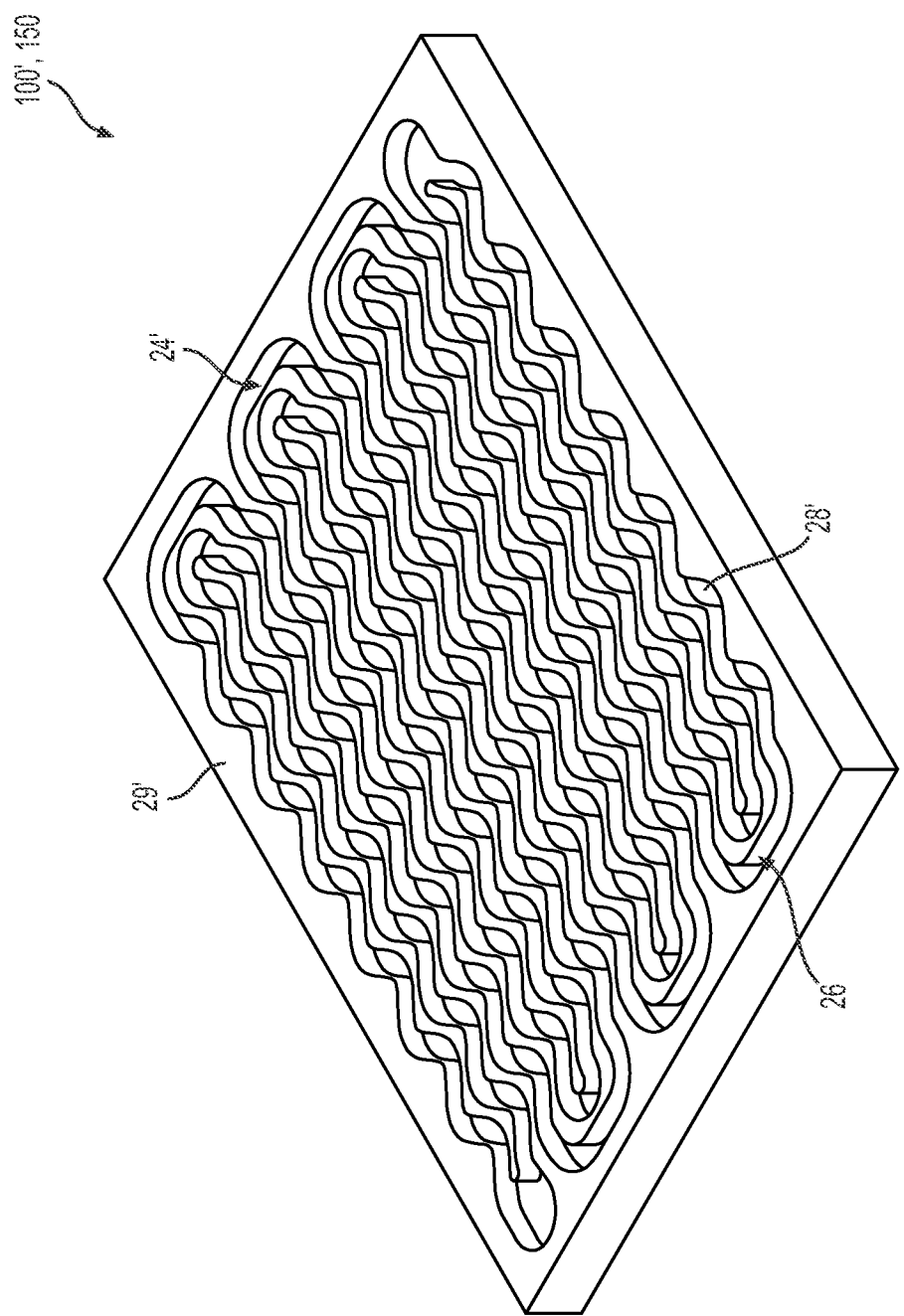
FIG. 20 is a perspective view of a base portion of a lower water block unit of the water block assembly of FIG. 19.
Figure 25:
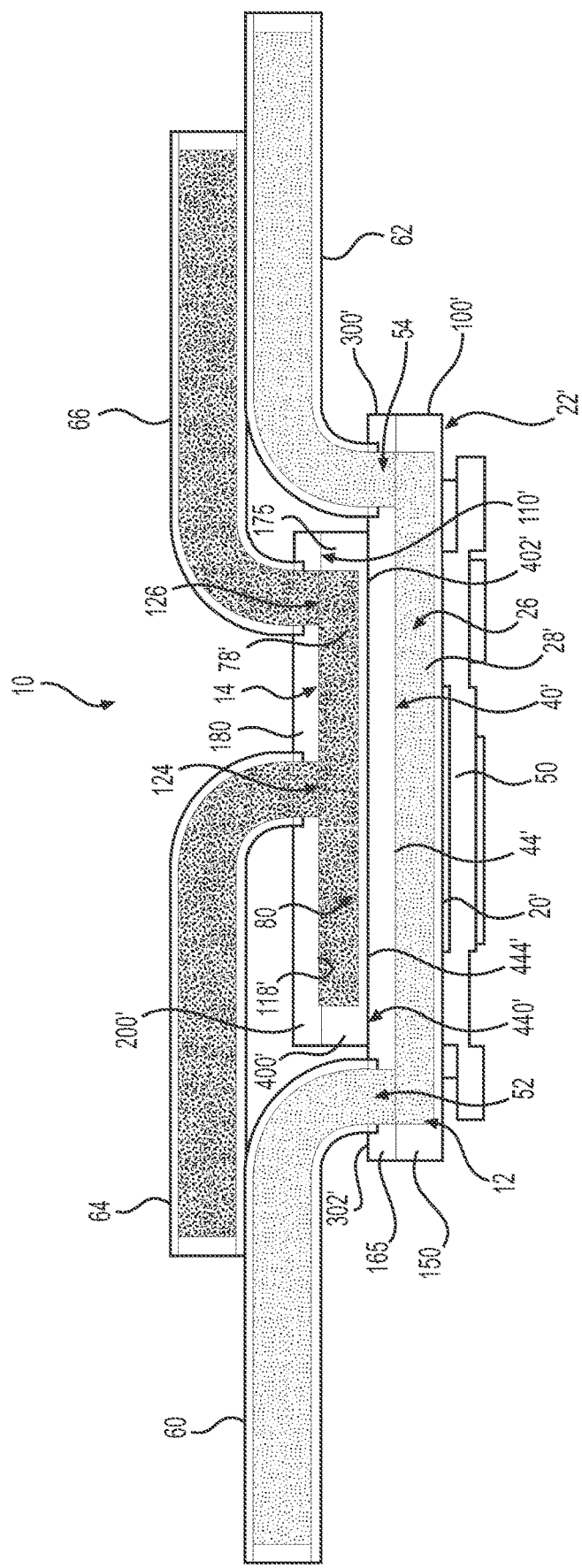
FIG. 25 is a side elevation view of the water block assembly of FIG. 24.

The lower plate member 100' defines the base portion 150 of the lower water block unit 12. As shown in FIG. 20, the lower plate member 100' is substantially similar to the lower plate member 100 described above with the exception that the lower plate member 100' does not define the pocket 25 and the locating rim 27. Rather, the upper side 24' of the lower plate member 100' defines a planar surface 29' similar to the surface 29 of the lower plate member 100. A recess 28' defined in the planar upper surface 29' of the lower plate member 100' is configured in the same manner shown and described with respect to the recess 28 of the lower plate member 100. As shown in FIG. 25, the lower side 22' of the lower plate member 100' defines a planar lower surface 20' which is placed in contact with the target component 50.

Figure 21:
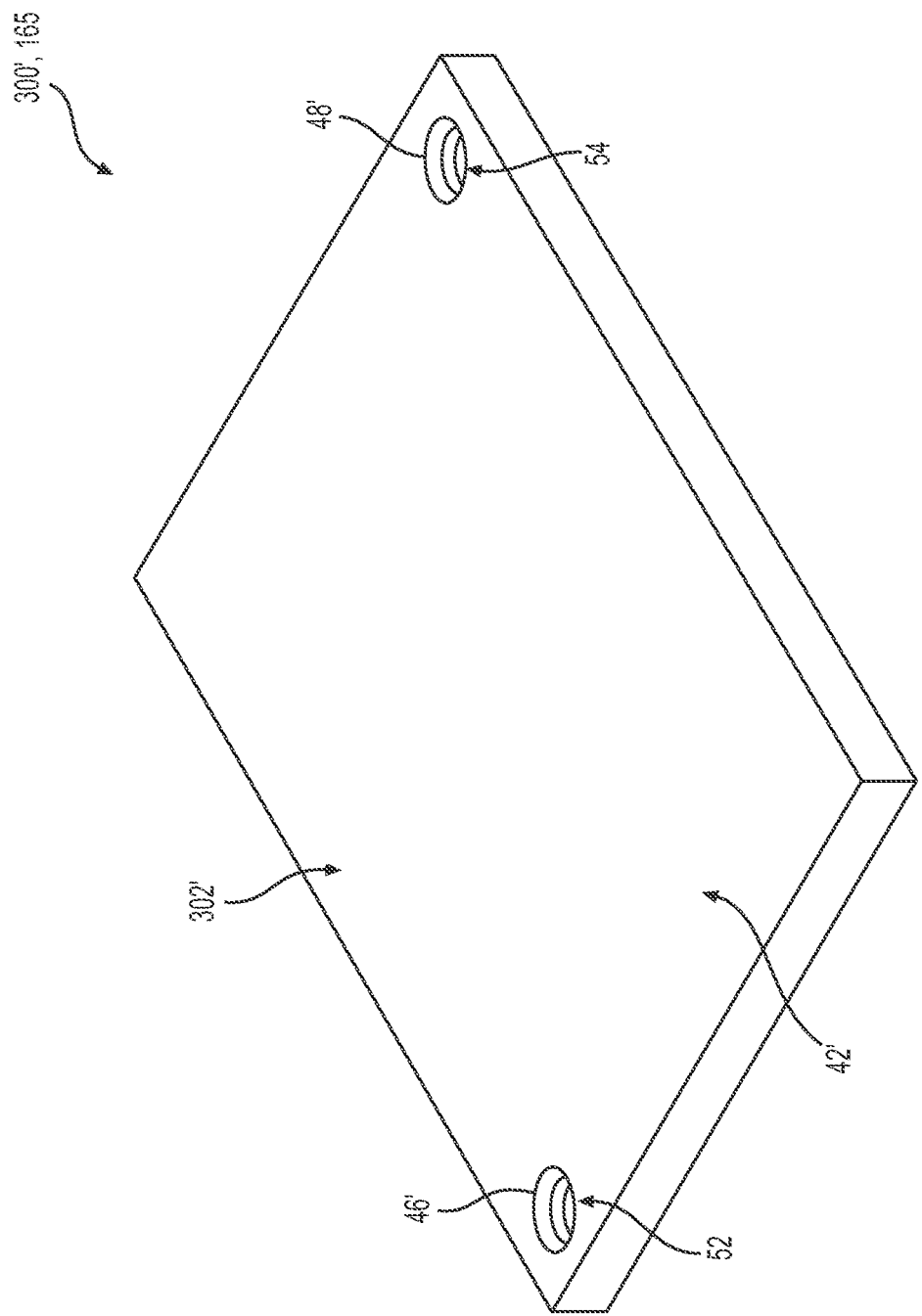
FIG. 21 is a perspective view of a cover portion of the lower water block unit of the water block assembly of FIG. 19.

The first intermediate plate member 300' defines the cover portion 165 of the lower water block unit 12. As shown in FIG. 21, in this embodiment, the first intermediate plate member 300' is similar to the intermediate plate member 300 described above, except that the upper side 42' of the first intermediate plate member 300' does not define a pocket, a locating rim and a recess such as the pocket 58, the locating rim 70 and the recess 78 of the intermediate plate member 300. Rather, the upper side 42' of the first intermediate plate member 300' defines a planar upper surface 302' that extends across the width and length of the first intermediate plate member 300'. As shown in FIG. 25, in this embodiment, the lower side 40' of the first intermediate plate member 300' defines a planar lower surface 44' similar to the planar lower surface 44 of the intermediate plate member 300. As such, in this embodiment, the recess 28' on the upper side 24' of the lower plate member 100' and the planar lower surface 44' of the first intermediate plate member 300' collaborate to define the fluid conduit 26 of the lower water block unit 12 (shown in FIGS. 24, 25).

It is contemplated that, in alternative embodiments, the first intermediate plate member 300' could define a recess on its lower side 40' similar to the recess 75. As mentioned above, this may be helpful to improve the cooling capacity of the water block assembly 10.

As will be understood, in this embodiment, the first intermediate plate member 300' is not received in a pocket of the lower plate member 100' since the lower plate member 100' does not define a pocket to receive the first intermediate plate member 300'. Rather, in this embodiment, the lower and first intermediate plate members 100', 300' have approximately similar dimensions (notably widths and lengths) such that their respective lateral and longitudinal ends are generally flush with one another.

In this embodiment, the lower and first intermediate plate members 100', 300' are welded to one another along an interface therebetween.

Figure 22:
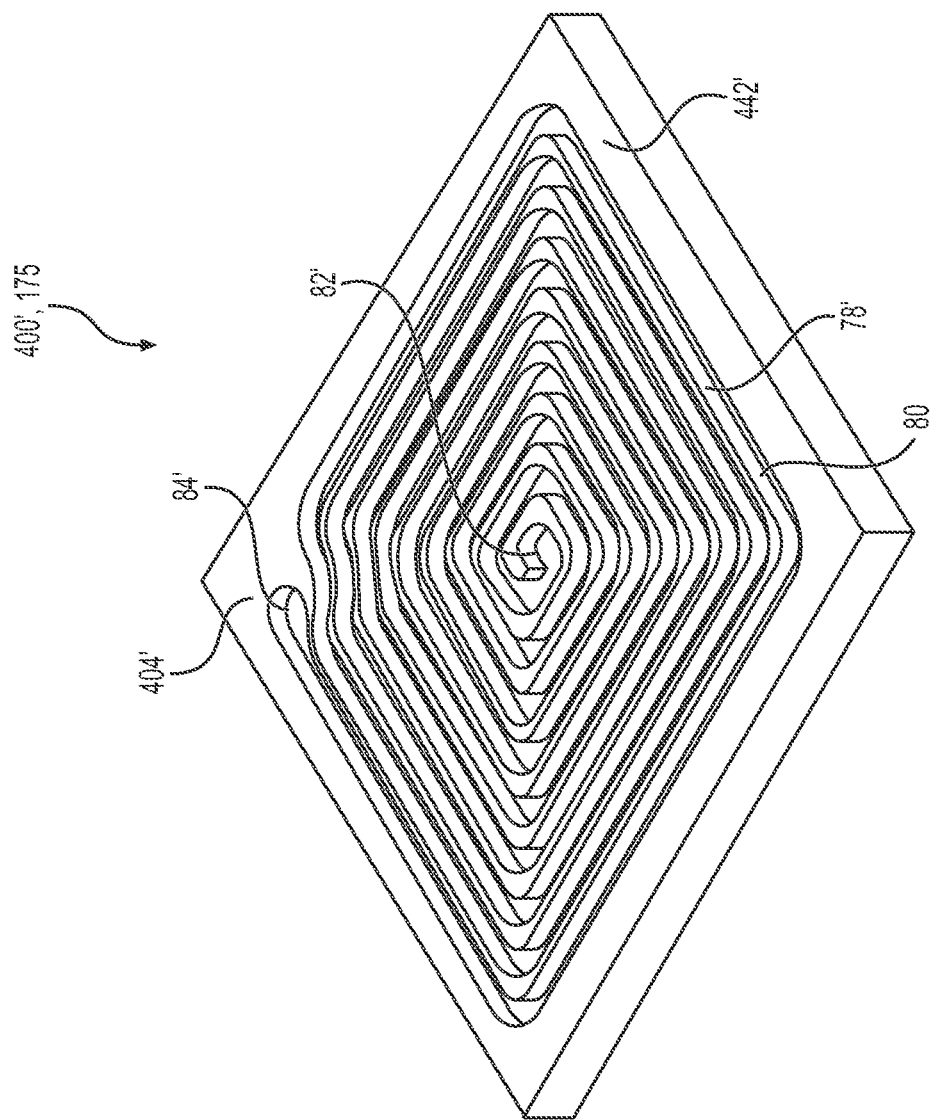
FIG. 22 is a perspective view of a base portion of an upper water block unit of the water block assembly of FIG. 19.

The second intermediate plate member 400' defines the base portion 175 of the upper water block unit 14. As shown in FIG. 22, in this embodiment, the second intermediate plate member 400' is similar to the intermediate plate member 300 described above, except that the upper side of the second intermediate plate member 400' does not define a pocket, a locating rim or openings extending therethrough. Rather, the upper side 442' of the second intermediate plate member 400' defines a planar upper surface 404' which defines a recess 78'. In this embodiment, the recess 78' defined in the upper surface 404' of the second intermediate plate member 400' has a different shape than the recess 78 of the intermediate plate member 300. Notably, the path of the upper fluid conduit 80 defined by the recess 78' is not serpentine as in the case of the recess 78 of the intermediate plate member 300. Rather, as can be seen in FIG. 22, in this embodiment, the recess 78' of the second intermediate plate member 400' is shaped such that the upper fluid conduit 80 forms a spiral path. The first end 82' of the recess 78', which corresponds to the fluid inlet 124 of the upper fluid conduit 80, is centered about the spiral shape of the fluid conduit 80. As such, in this embodiment, the fluid inlet 124 is generally centered relative to the upper water block unit 14. The second end 84' of the recess 78', which corresponds to the fluid outlet 126 of the upper fluid conduit 80, is located proximate a corner of the second intermediate plate member 400'. As such, the fluid outlet 126 is located at a corner of the upper water block unit 14, coinciding with an outer periphery of the spiral path of the upper fluid conduit 80. As shown in FIG. 25, the lower side 440' of the second intermediate plate member 400' defines a planar lower surface 444' which, in use, is placed in contact with the planar upper surface 302' of the first intermediate plate member 300'.

It is contemplated that, in other embodiments, the recess 78' defined in the upper surface 404' of the second intermediate plate member 400' could have the same shape as the recess 78 of the intermediate plate member 300, or any other suitable shape.

Figure 23:
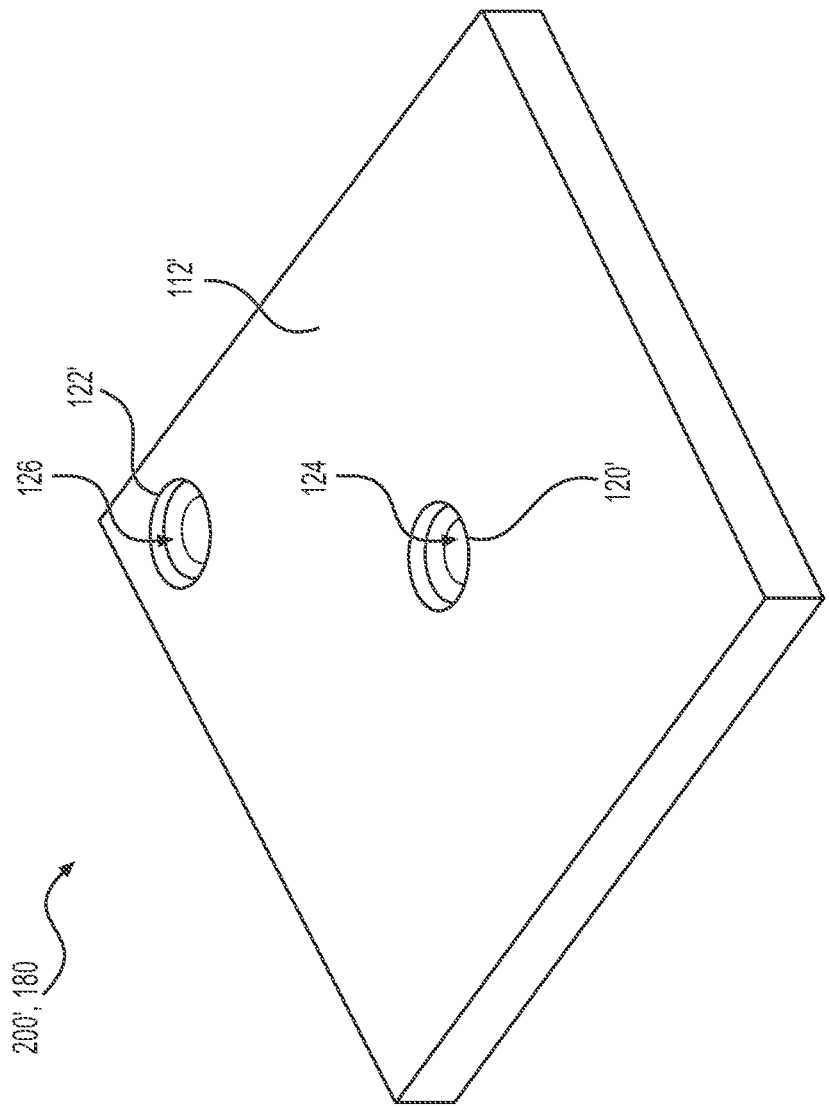
FIG. 23 is a perspective view of a cover portion of the upper water block unit of the water block assembly of FIG. 19.
Figure 24:
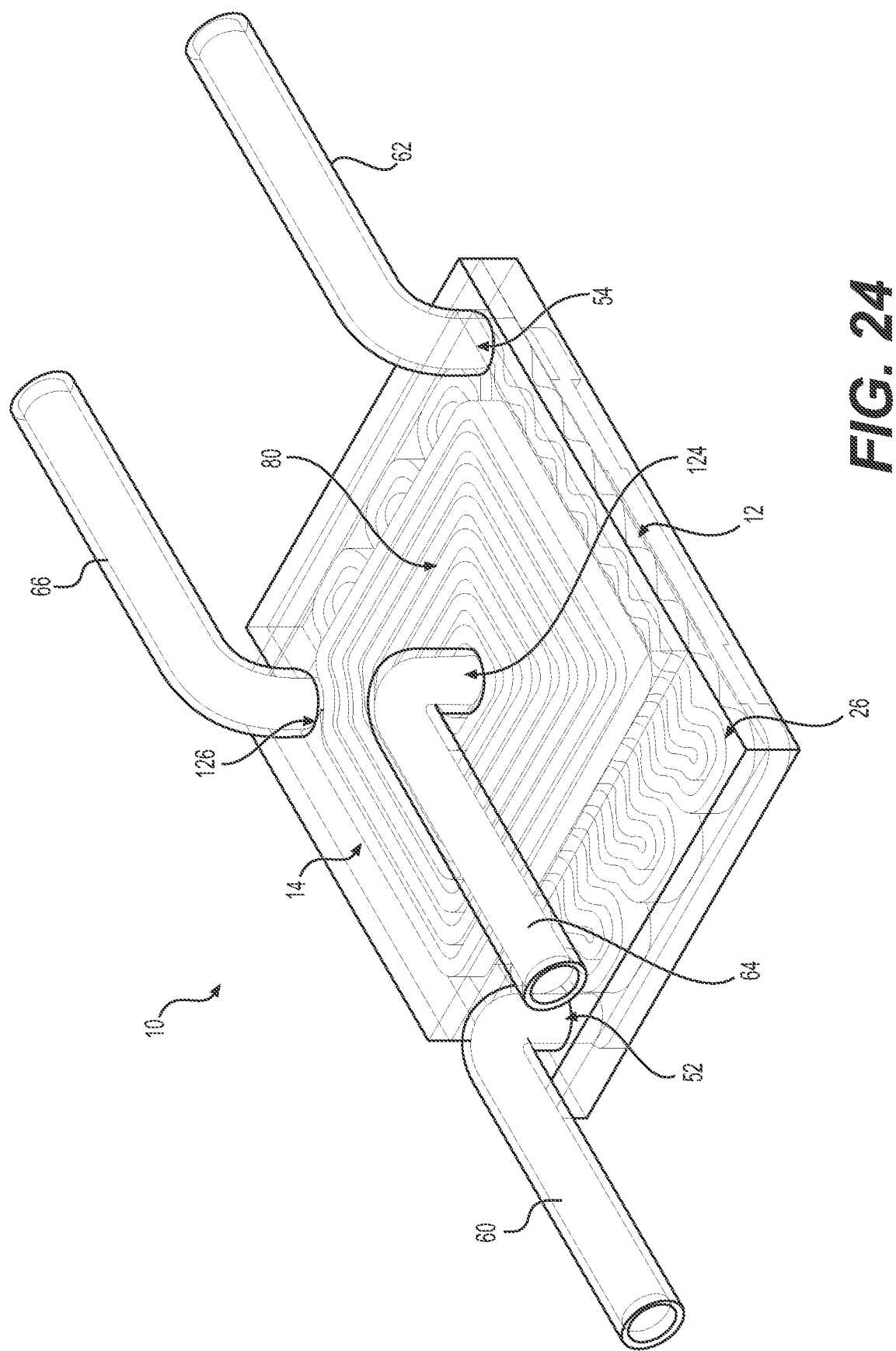
FIG. 24 is a perspective view of the water block assembly of FIG. 18, in which the plate members thereof are shown in transparency to expose the lower and upper fluid conduits of the water block assembly, with the target component to be cooled illustrated for reference.

The upper plate member 200' defines the cover portion 180 of the upper water block unit 14. As shown in FIG. 23, in this embodiment, the upper plate member 200' is similar to the upper plate member 200 described above, except that the periphery of the upper plate member 200' does not have the optional orientation feature 130 which is present in the upper plate member 200. In this embodiment, as shown in FIG. 25, the lower side 110' of the upper plate member 200' defines a planar lower surface 118' similar to the planar lower surface 118 of the upper plate member 200. As such, the recess 78' on the upper side 442' of the second intermediate plate member 400' and the planar lower surface 118' of the upper plate member 200' collaborate to define the fluid conduit 80 of the upper water block unit 14 (shown in FIGS. 24, 25). The upper plate member 200' also defines openings 120', 122' which define the fluid inlet 124 and the fluid outlet 126 of the upper fluid conduit 80 of the upper water block unit 14. Since, in this embodiment, the first end 82' of the recess 78' of the second intermediate plate member 400' is located centrally with respect to the second intermediate plate member 400', the opening 120' (and thus the fluid inlet 124) is located centrally with respect to the upper plate member 200' such that the opening 120' and the first end 82' can be aligned during assembly. The opening 122' (and thus the fluid outlet 126) is located proximate a corner of the upper plate member 200' similarly to the opening 122 of the upper plate member 200 described above, such that the opening 122' and the second end 84' can be aligned during assembly.

As will be understood, in this embodiment, the upper plate member 200' is not received in a pocket of the second intermediate plate member 400' since the second intermediate plate member 400' does not define a pocket to receive the upper plate member 200'. Rather, in this embodiment, the first intermediate and upper plate members 400', 200' have approximately similar dimensions (notably widths and lengths) such that their respective lateral and longitudinal ends are generally flush with one another. It is noted that the lengths of the first intermediate and upper plate members 400', 200' is less than the lengths of the lower and first intermediate plate members 100', 300'. The fluid inlet 52 and the fluid outlet 54 of the lower fluid conduit 26 are thus disposed on opposite longitudinal sides of the upper water block unit 14.

In this embodiment, the first intermediate and upper plate members 400', 200' are welded to one another along an interface therebetween.

Thus, as will be understood, in this embodiment, the base portion 150, the cover portion 165, the base portion 175 and the cover portion 180 which make up the lower and upper water block units 12, 14 are all separate components. Notably, the heat transfer interface between the cover portion 165 and the base portion 175 is defined between the external upper surface 302' and the external lower surface 444' of the cover portion 165 and the base portion 175 respectively. A thermal paste may be applied between the external upper surface 302' of the cover portion 165 and the external lower surface of the base portion 175. As such, the cover portion 165 and the base portion 175 are in thermal contact such that heat is transferred from the lower water block unit 12 to the upper water block unit 14.

While this embodiment of the water block assembly 10 includes more components (i.e., an additional plate member), similar benefits to those described above can be obtained in terms of assuring redundancy in the water block assembly 10, albeit with a reduced efficiency. Notably, the embodiment of the water block assembly 10 illustrated in FIGS. 1 to 4 is simpler to assemble as it includes fewer components, and provides a greater efficiency as the heat transfer interface between the lower and upper water block units 12, 14 is constituted by the material of one of the plate members (intermediate plate member 300).

Modifications and improvements to the above-described embodiments of the present technology may become apparent to those skilled in the art. The foregoing description is intended to be exemplary rather than limiting. The scope of the present technology is therefore intended to be limited solely by the scope of the appended claims.

What is claimed is:

1. A water block assembly configured to be installed on a target component, the water block assembly comprising:
    a first water block unit having a first fluid conduit, the first water block unit comprising:
        a first base portion having an external thermal transfer surface configured to be in contact with the target component, the first base portion partly defining the first fluid conduit; and
        a first cover portion disposed on and affixed to the first base portion, the first cover portion defining a first fluid inlet and a first fluid outlet, the first cover portion partly defining the first fluid conduit;
    a second water block unit stacked on the first water block unit such that, in use, the first water block unit is disposed between the second water block unit and the target component, the second water block unit having a second fluid conduit, the second water block unit comprising:
        a second base portion in thermal contact with the first cover portion of the first water block unit, the second base portion partly defining the second fluid conduit, the second base portion being dimensioned smaller than the first cover portion such that a section of the first cover portion extends outward from the second base portion, the first fluid inlet and the first fluid outlet being defined in the section of the first cover portion that extends outward from the second base portion; and
        a second cover portion disposed on and affixed to the second base portion, the second cover portion defining a second fluid inlet and a second fluid outlet, the second cover portion partly defining the second fluid conduit,
    and
    a lower member, an intermediate member and an upper member affixed to one another to form the first and second water block units, wherein:
        the lower member defines the first base portion of the first water block unit, a lower side of the lower member defining the external thermal transfer surface configured to be in contact with the target component;
        the intermediate member defines the first cover portion of the first water block unit and the second base portion of the second water block unit such that a heat transfer interface between the first cover portion and the second base portion is constituted by a material of the intermediate member, the intermediate member being formed as a unitary piece; and
        the upper member defines the second cover portion of the second water block unit,
    wherein the first fluid conduit and the second fluid conduit operate either: (i) fluidly independent from one another such that the first and second fluid conduits are fed by respective fluid sources; or (ii) in parallel such that the first and second fluid conduits are fed by a common fluid source; and
    wherein, within the water block assembly, the upper member is in fluid connection with only the second fluid conduit—[the upper member does not form a part of the first water block unit].

2. The water block assembly of claim 1, wherein each of the first and second base portions defines a recess defining at least in part a path of a corresponding one of the first and second fluid conduits.

3. The water block assembly of claim 2, wherein the first cover portion comprises a plurality of fins projecting downwardly toward the first base portion, the fins being received in respective locations within the recess of the first base portion.

4. The water block assembly of claim 2, wherein the first cover portion comprises a recess that is complementary to the recess of the first base portion such that the recess of the first cover portion and the recess of the first base portion collaborate with one another to define the first fluid conduit.

5. The water block assembly of claim 2, wherein:
    the recess of the first base portion is a first recess;
    the recess of the second base portion is a second recess;
    the first recess of the first base portion extends from a first end to a second end, the first end and the second end of the first recess being aligned with the first fluid inlet and the first fluid outlet respectively; and
    the second recess of the second base portion extends from a first end to a second end, the first end and the second end of the second recess being aligned with the second fluid inlet and the second fluid outlet respectively.

6. The water block assembly of claim 2, wherein the recesses of the first and second base portions are milled.

7. The water block assembly of claim 1, wherein each of the first and second base portions defines a pocket for receiving a corresponding one of the first and second cover portions.

8. The water block assembly of claim 1, wherein each of the first and second cover portions defines a generally planar lower surface facing a corresponding one of the first and second base portions and defining in part one of the first and second fluid conduits.

9. The water block assembly of claim 1, wherein:
    the first and second cover portions are generally rectangular;
    the first fluid inlet and the first fluid outlet are located proximate diagonally opposite corners of the first cover portion; and
    the second fluid inlet and the second fluid outlet are located proximate diagonally opposite corners of the second cover portion.

10. The water block assembly of claim 1, wherein:
- the second cover portion has a first orientation feature for orienting the second cover portion relative to the second base portion; and
- the second base portion has a corresponding second orientation feature for orienting the second cover portion relative to the second base portion that matches the first orientation feature.

11. The water block assembly of claim 1, wherein:
- the intermediate member has a lower side and an upper side opposite the lower side;
- the lower side of the intermediate member defines at least in part the first cover portion of the first water block unit; and
- the upper side of the intermediate member defines at least in part the second base portion of the second water block unit.

12. The water block assembly of claim 1, wherein the first fluid conduit and the second fluid conduit operate fluidly independent from one another, the first and second fluid conduits being respectively fed with a first fluid and a second fluid by the respective fluid sources.

13. The water block assembly of claim 1, wherein the first fluid conduit and the second fluid conduit operate in parallel on a same fluid circuit, each of the first fluid conduit and the second fluid conduit being fed a same fluid by the common fluid source.

14. The water block assembly of claim 1, further comprising:
- two first tubes connected to the first fluid inlet and the first fluid outlet; and
- two second tubes connected to the second fluid inlet and the second fluid outlet,
- the two first tubes being connected to the first water block unit at the first cover portion,
- the two second tubes being connected to the second water block unit at the second cover portion.

15. The water block assembly of claim 1, wherein the water block assembly includes only three separate plate members including the lower member, the intermediate member and the upper member.

16. The water block assembly of claim 1, wherein:
- the first fluid inlet forms a first opening on a top surface of the intermediate member;
- the second fluid inlet forms a second opening on a top surface of the upper member;
- the first fluid outlet forms a third opening on the top surface of the intermediate member; and
- the second fluid outlet forms a fourth opening on the top surface of the upper member.

17. A water block assembly configured to be installed on a target component, the water block assembly comprising:
- a lower member having an external thermal transfer surface configured to be in contact with the target component;
- an intermediate member formed as a unitary piece and disposed on and affixed to the lower member such that, together, the lower member and the intermediate member form a first water block unit of the water block assembly, each of the lower member and the intermediate member defining in part a first fluid conduit of the first water block unit, the intermediate member defining a first fluid inlet and a first fluid outlet of the first fluid conduit; and
- an upper member disposed on and affixed to the intermediate member such that, together, the intermediate member and the upper member form a second water block unit of the water block assembly stacked on the first water block unit, in use, the first water block unit being disposed between the second water block unit and the target component, each of the intermediate member and the upper member defining in part a second fluid conduit of the second water block unit, the upper member defining a second fluid inlet and a second fluid outlet of the second fluid conduit,
- wherein a heat transfer interface between the first water block unit and the second water block unit is constituted by a material of the intermediate member; and
- wherein, within the water block assembly, the upper member is in fluid connection with only the second fluid conduit—[the upper member does not form a part of the first water block unit].

18. The water block assembly of claim 17, wherein:
- the first fluid inlet forms a first opening on a top surface of the intermediate member;
- the second fluid inlet forms a second opening on a top surface of the upper member;
- the first fluid outlet forms a third opening on the top surface of the intermediate member; and
- the second fluid outlet forms a fourth opening on the top surface of the upper member.

\* \* \* \* \*

UNITED STATES PATENT AND TRADEMARK OFFICE
CERTIFICATE OF CORRECTION

| | | |
|---|---|---|
| PATENT NO. | : 11,664,295 B2 | Page 1 of 1 |
| APPLICATION NO. | : 16/878117 | |
| DATED | : May 30, 2023 | |
| INVENTOR(S) | : Ali Chehade | |

It is certified that error appears in the above-identified patent and that said Letters Patent is hereby corrected as shown below:

In the Claims

Column 20, Claim 1, Lines 20-23, should read --member is in fluid connection with only the second fluid conduit.--

Column 22, Claim 17, Lines 34-36, should read --member is in fluid connection with only the second fluid conduit.--

Signed and Sealed this
Twenty-seventh Day of June, 2023

Katherine Kelly Vidal
*Director of the United States Patent and Trademark Office*